US012727465B2

(12) United States Patent
Clevenger et al.

(10) Patent No.: US 12,727,465 B2
(45) Date of Patent: Sep. 1, 2026

(54) STRUCTURE FOR BACKSIDE SIGNAL AND POWER

(71) Applicant: INTERNATIONAL BUSINESS MACHINES CORPORATION, Armonk, NY (US)

(72) Inventors: Lawrence A. Clevenger, Saratoga Springs, NY (US); Ruilong Xie, Niskayuna, NY (US); Albert M. Chu, Nashua, NH (US); Nicholas Anthony Lanzillo, Wynantskill, NY (US); Brent A. Anderson, Jericho, VT (US); Reinaldo Vega, Mahopac, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 492 days.

(21) Appl. No.: 18/334,606

(22) Filed: Jun. 14, 2023

(65) Prior Publication Data

US 2024/0421087 A1 Dec. 19, 2024

(51) Int. Cl.

| | |
|---|---|
| ***H10W 20/40*** | (2026.01) |
| ***B82Y 10/00*** | (2011.01) |
| ***H10D 30/43*** | (2025.01) |
| ***H10D 30/67*** | (2025.01) |
| ***H10D 62/10*** | (2025.01) |

(Continued)

(52) U.S. Cl.

CPC .......... *H10W 20/427* (2026.01); *H10D 30/43* (2025.01); *H10D 30/6735* (2025.01); *H10D 62/121* (2025.01); *H10D 64/256* (2025.01); *H10D 84/83* (2025.01)

(58) Field of Classification Search

CPC ..... B82Y 10/00; H01L 23/481; H01L 23/485; H01L 23/5286; H10D 30/0198; H10D 30/43; H10D 30/501; H10D 30/6735; H10D 30/6757; H10D 62/116; H10D 62/121; H10D 64/017; H10D 64/254; H10D 64/256; H10D 84/0149; H10D 84/83; H10D 84/832; H10W 20/0245; H10W 20/20; H10W 20/40; H10W 20/427; H10W 20/481

See application file for complete search history.

(56) References Cited

U.S. PATENT DOCUMENTS

| | | | |
|---|---|---|---|
| 10,797,139 | B2 | 10/2020 | Morrow |
| 11,121,086 | B2 | 9/2021 | Hiblot |

(Continued)

OTHER PUBLICATIONS

Mathur et al., “Buried Interconnects for Sub-5 nm SRAM Design”, in IEEE Transactions on Electron Devices, vol. 69, No. 3, Mar. 2022, pp. 1041-1047. doi: 10.1109/TED.2022.3143078.

*Primary Examiner* — Wael M Fahmy
*Assistant Examiner* — Alice W Tang
(74) *Attorney, Agent, or Firm* — Robert R. Aragona

(57) ABSTRACT

According to the embodiment of the present invention, a semiconductor device includes a first nanodevice comprised of a plurality of first transistors and a second nanodevice comprised of a plurality of second transistors. The second nanodevice is located adjacent to and parallel to the first nanodevice along an x-axis. A first backside signal line and a second backside signal line are located at a cell boundary of the first nanodevice. A first gap exists between the first backside signal line and the second backside signal line.

20 Claims, 39 Drawing Sheets

Top Down View

(51) Int. Cl.

| | |
|---|---|
| ***H10D 64/23*** | (2025.01) |
| ***H10D 84/83*** | (2025.01) |
| ***H10W 20/20*** | (2026.01) |
| ***H10W 20/41*** | (2026.01) |

(56) References Cited

U.S. PATENT DOCUMENTS

| | | | | |
|---|---|---|---|---|
| 11,271,567 | B1 | 3/2022 | Chen | |
| 11,315,928 | B2 | 4/2022 | Shih | |
| 11,437,379 | B2 | 9/2022 | Song | |
| 11,469,221 | B2 * | 10/2022 | Wang et al. | H01L 27/0207 |
| 11,552,084 | B2 * | 1/2023 | Wang et al. | H01L 27/1108 |
| 11,569,168 | B2 | 1/2023 | Wu | |
| 2018/0218973 | A1 | 8/2018 | Nelson | |
| 2019/0164882 | A1 * | 5/2019 | Chen et al. | H01L 23/528 |
| 2020/0105671 | A1 | 4/2020 | Lai | |
| 2021/0104435 | A1 | 4/2021 | Son | |
| 2021/0111115 | A1 | 4/2021 | Morrow | |
| 2021/0118798 | A1 | 4/2021 | Liebmann | |
| 2021/0134721 | A1 | 5/2021 | Chiang | |
| 2021/0167066 | A1 * | 6/2021 | Vishwanath et al. | H01L 27/0924 |
| 2021/0202385 | A1 | 7/2021 | Huang | |
| 2021/0366916 | A1 * | 11/2021 | Ye et al. | H01L 27/1108 |
| 2022/0384344 | A1 | 12/2022 | Chen | |
| 2023/0036522 | A1 * | 2/2023 | Chen et al. | H01L 23/5286 |
| 2023/0040094 | A1 | 2/2023 | Huang | |
| 2024/0105611 | A1 * | 3/2024 | Clevenger et al. | H01L 23/5286 |

* cited by examiner

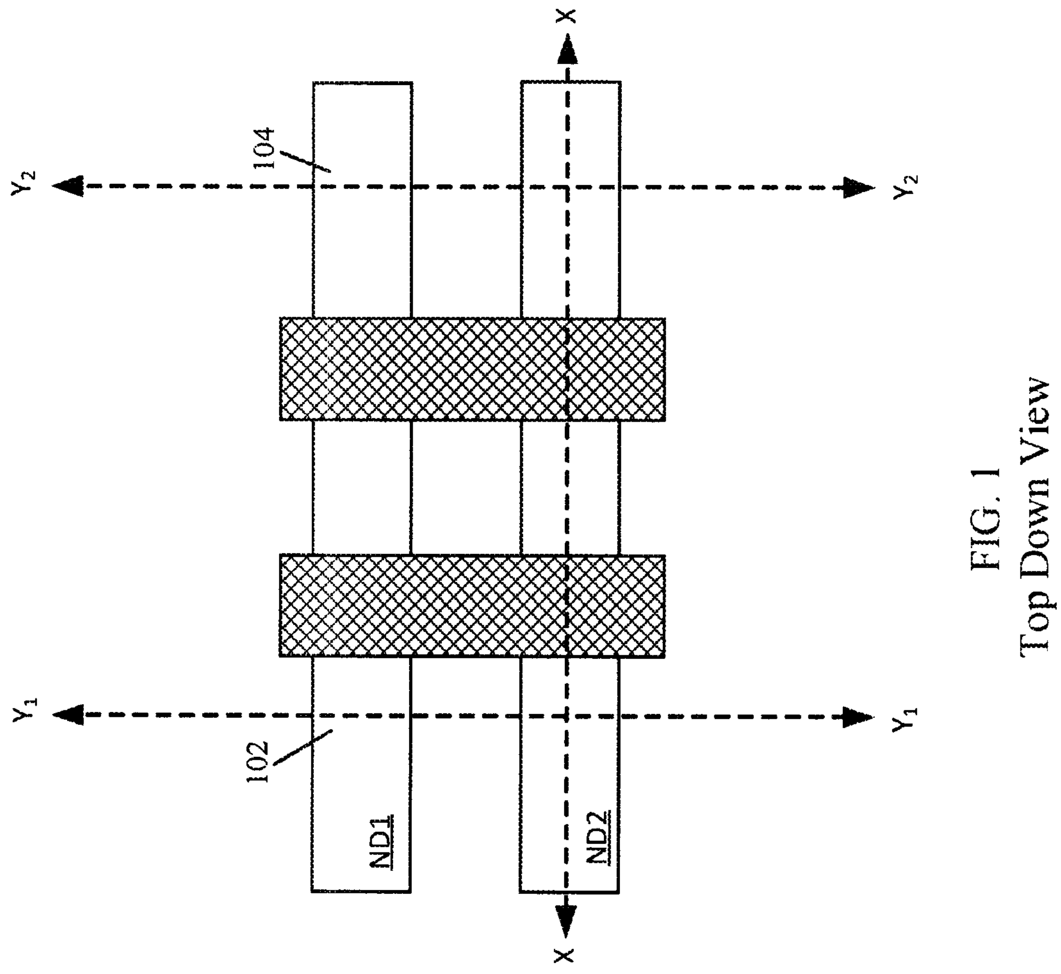
FIG. 1
Top Down View
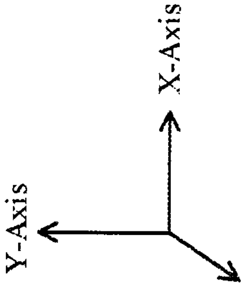

Cross Section X

Cross Section $Y_2$

Cross Section $Y_1$

Cross Section X

Cross Section $Y_2$

Cross Section $Y_1$

Cross Section X

Cross Section $Y_2$

Cross Section $Y_1$

Cross Section X

Cross Section $Y_2$

Cross Section $Y_1$

Cross Section X

Cross Section $Y_2$

Cross Section $Y_1$

Cross Section X

Cross Section $Y_2$

Cross Section $Y_1$

Cross Section X

Cross Section $Y_2$

Cross Section $Y_1$

Cross Section X

Cross Section $Y_2$

Cross Section $Y_1$

Cross Section X

Cross Section $Y_2$

Cross Section $Y_1$

Cross Section X

Cross Section $Y_2$

Cross Section $Y_1$

Cross Section X

Cross Section $Y_2$

Cross Section $Y_1$

Cross Section X

Cross Section $Y_2$

Cross Section $Y_1$

Cross Section X

Cross Section $Y_2$

Cross Section $Y_1$

Top Down View

Cross Section X

Cross Section $Y_1$

Cross Section $Y_2$

Cross Section X

Cross Section $Y_2$

Cross Section $Y_1$

Cross Section X

Cross Section $Y_2$

Cross Section $Y_1$

Cross Section X

Cross Section $Y_2$

Cross Section $Y_1$

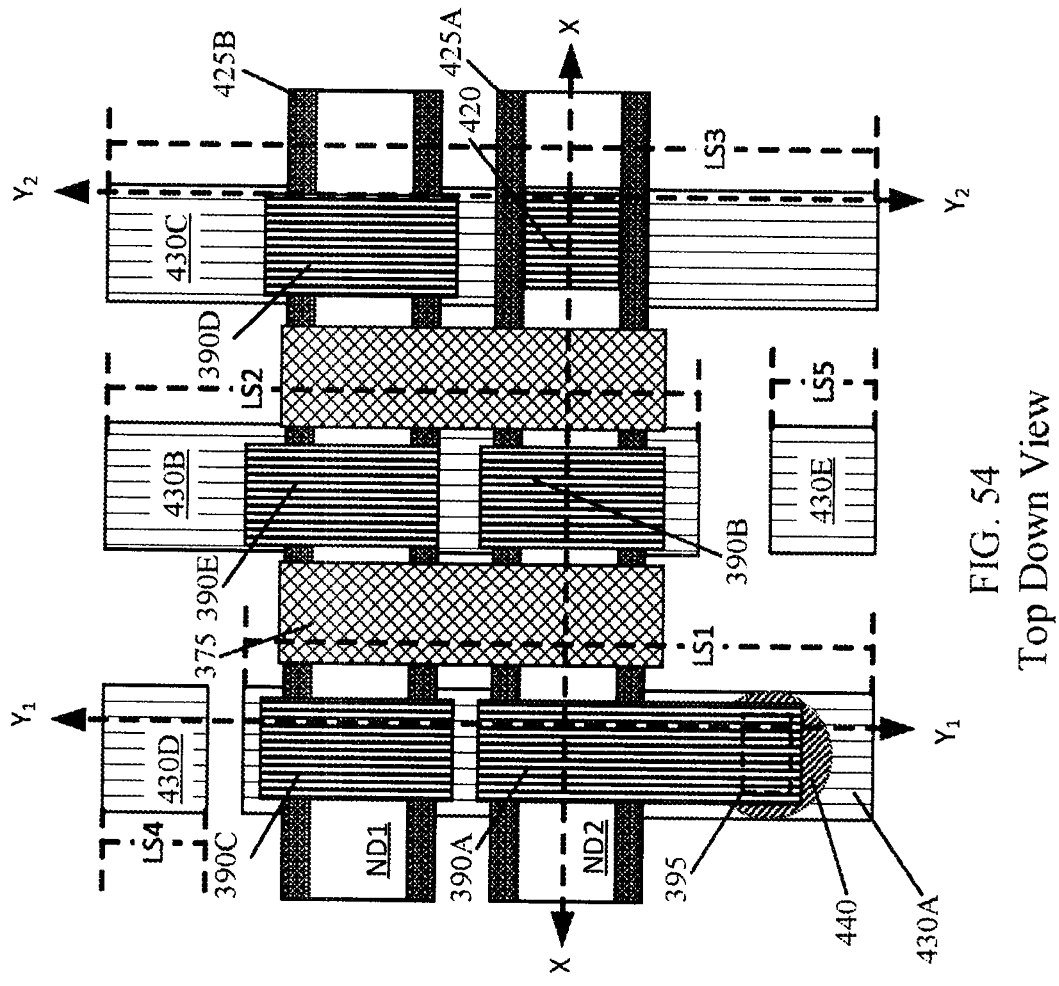
FIG. 54
Top Down View
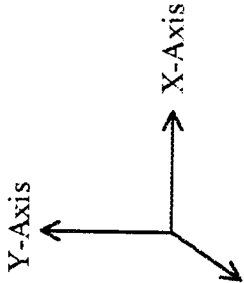

Cross Section X

Cross Section $Y_1$

Cross Section $Y_2$

STRUCTURE FOR BACKSIDE SIGNAL AND POWER

BACKGROUND

The present invention relates generally to the field of microelectronics, and more particularly to a semiconductor device structure, and a method for forming a semiconductor device.

A nanosheet (NS) is the lead device architecture in continuing CMOS scaling. However, nanosheet technology has shown issues when scaling down such that as the devices become smaller and closer together, they are interfering with each other. Furthermore, as the devices become smaller and closer together, forming the connections to a backside power network is becoming more difficult.

SUMMARY

According to the embodiment of the present invention, a semiconductor device includes a first nanodevice comprised of a plurality of first transistors and a second nanodevice comprised of a plurality of second transistors. The second nanodevice is located adjacent to and parallel to the first nanodevice along an x-axis. A first backside signal line and a second backside signal line are located at a cell boundary of the first nanodevice. A first gap exists between the first backside signal line and the second backside signal line.

According to the embodiment of the present invention, a width of the first gap parallel to the x-axis is from 5 nanometers (nm) to 100 nm.

According to the embodiment of the present invention, the semiconductor device further comprises a first backside power rail (BPR) located adjacent to and parallel to the first backside signal line and the second backside signal line along the x-axis. A width of the first BPR parallel to the x-axis is greater than a width of the first backside signal line and the second backside signal line parallel to the x-axis.

According to the embodiment of the present invention, the semiconductor device further comprises a second BPR located adjacent to and parallel to the first BPR along the x-axis. A width of the second BPR parallel to the x-axis is equivalent to the width of the first BPR parallel to the x-axis.

According to the embodiment of the present invention, the width of the first backside signal line and the second backside signal line parallel to the x-axis is 20 nm.

According to the embodiment of the present invention, the width of the first BPR and the second BPR parallel to the x-axis is 40 nm.

According to the embodiment of the present invention, a semiconductor device includes a first nanodevice comprised of a plurality of first transistors and a second nanodevice comprised of a plurality of second transistors. The second nanodevice is located adjacent to and parallel to the first nanodevice along an x-axis. A first backside signal line and a second backside signal line are located at a cell boundary of the first nanodevice. A first gap exists between the first backside signal line and the second backside signal line. A third backside signal line and a fourth backside signal line are located at a cell boundary of the second nanodevice. A second gap exists between the third backside signal line and the fourth backside signal line.

According to the embodiment of the present invention, a width of the first gap parallel to the x-axis is from 5 nm to 100 nm. A width of the second gap parallel to the x-axis is equivalent to the width of the first gap parallel to the x-axis.

According to the embodiment of the present invention, the semiconductor device further comprises a first BPR and a second BPR located between the first backside signal line, the second backside signal line, the third backside signal line, and the fourth backside signal line. A width of the first BPR and the second BPR parallel to the x-axis is greater than a width of the first backside signal line, the second backside signal line, the third backside signal line, and the fourth backside signal line parallel to the x-axis.

According to the embodiment of the present invention, the first BPR, the second BPR, the first backside signal line, the second backside signal line, the third backside signal line, and the fourth backside signal line are substantially in a same plane.

According to the embodiment of the present invention, the width of the first backside signal line, the second backside signal line, the third backside signal line, and the fourth backside signal line parallel to the x-axis is 20 nm.

According to the embodiment of the present invention, the width of the first BPR and the second BPR parallel to the x-axis is 40 nm.

According to the embodiment of the present invention, the semiconductor device further comprises a source/drain contact including a via (VBPS). The VBPS extends downwards to connect to a frontside of the third backside signal line.

According to the embodiment of the present invention, a source/drain is in direct contact with a backside of the source/drain contact. The third backside signal line is connected to the source/drain by the VBPS.

According to the embodiment of the present invention, a semiconductor device includes a first nanodevice comprised of a plurality of first transistors and a second nanodevice comprised of a plurality of second transistors. The first nanodevice includes a first BPR. The second nanodevice includes a second BPR. The second nanodevice is located adjacent to and parallel to the first nanodevice along an x-axis. A first backside signal line, a second backside signal line, and a third backside signal line extend perpendicular to the x-axis along a y-axis through the first nanodevice and the second nanodevice. The first backside signal line, the second backside signal line, and the third backside signal line overlap the first BPR and the second BPR along the y-axis.

According to the embodiment of the present invention, the third backside signal line bypasses the first BPR and the second BPR along the y-axis.

According to the embodiment of the present invention, the semiconductor device further comprises a fourth backside signal line located at a cell boundary of the first nanodevice and a fifth backside signal line located at a cell boundary of the second nanodevice.

According to the embodiment of the present invention, the first backside signal line, the second backside signal line, the third backside signal line, the fourth backside signal line, and the fifth backside signal line are substantially in a same plane.

According to the embodiment of the present invention, the first BPR and the second BPR lie in a different plane than the first backside signal line, the second backside signal line, the third backside signal line, the fourth backside signal line, and the fifth backside signal line.

According to the embodiment of the present invention, a length of the first backside signal line, the second backside signal line, the third backside signal line, the fourth backside signal line, and the fifth backside signal line parallel to the y-axis is from 25 nm to 500 nm.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 1 illustrates a top-down view of a plurality of nanodevices, in accordance with the embodiment of the present invention.

FIG. 54 illustrates a top-down view of the plurality of nanodevices after the formation of the VBPS, the skip via, the plurality of source/drain contacts, the backside contact, the plurality of BPRs, and the plurality of backside signal lines, in accordance with the embodiment of the present invention.

DETAILED DESCRIPTION

Figure 2:
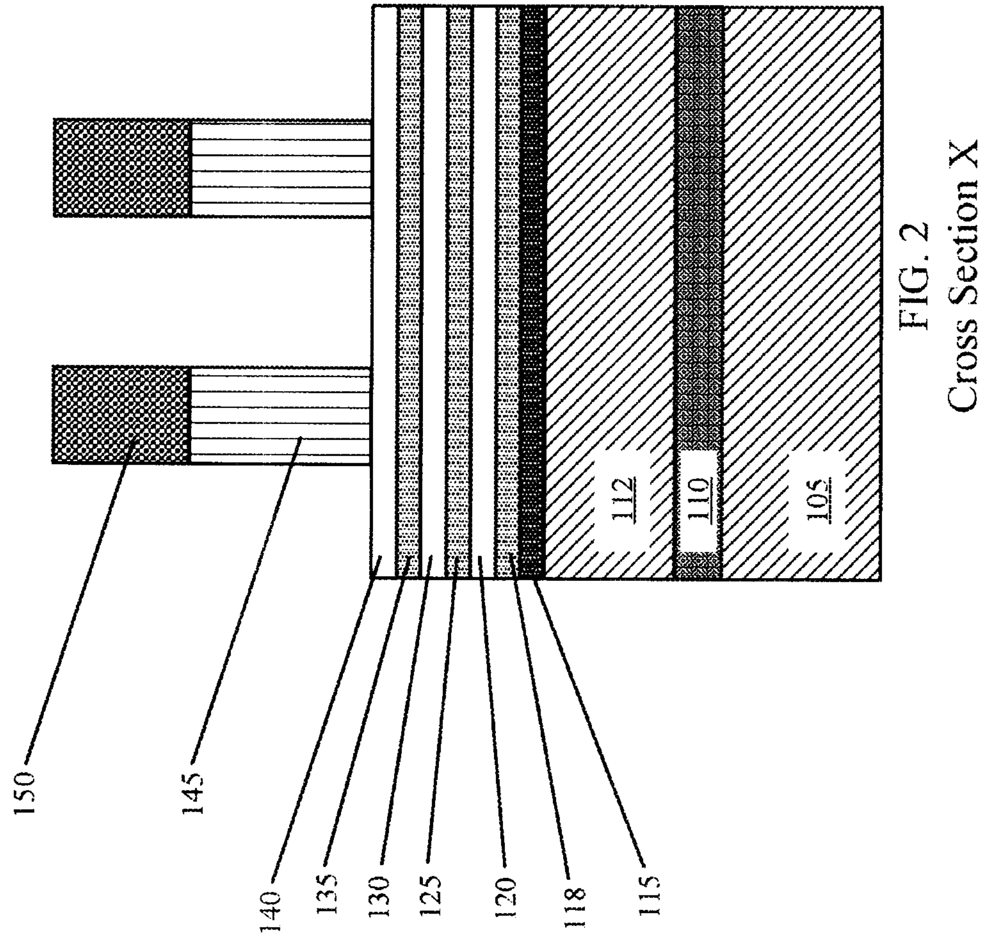
FIGS. 2-4 illustrate cross sections X, $Y_1$, and $Y_2$, respectively, of a plurality of nanodevices after nanosheet formation, shallow trench isolation (STI) region formation, dummy gate formation, gate hard mask formation, and etch stop layer formation, in accordance with the embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

References in the specification to "one embodiment," "an embodiment," "an example embodiment," etc., indicate that the embodiment described may include a particular feature, structure, or characteristic, but every embodiment may not include the particular feature, structure, or characteristic.

Moreover, such phrases are not necessarily referring to the same embodiment. Further, when a particular feature, structure, or characteristic is described in connection with an embodiment, it is submitted that it is within the knowledge of one of ordinary skill in the art to affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "formed on," or "formed atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be a direct or indirect positional relationship. As an example of an indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both an indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes which are used to form a micro-chip that will be packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout.

When a via to the backside power rail (VBPR) extends downwards from a frontside contact the VBPR may be located between two active regions on a nanodevice. The downwards extending VBPR is connected to a component, for example, a backside power rail. Therefore, backside wiring is currently only used for power distribution. Utilizing the backside wiring in this manner results in a larger cell size.

By inserting a power distribution network containing power rails and signal lines on the backside of a nanodevice, the cell size may be reduced. Additionally, by arranging the backside power rails and signal lines on different backside metal levels of the nanodevice, more wiring tracks may be freed on an upper metal level. The present invention does not require that all advantages need to be incorporated into every embodiment of the invention.

The present invention is directed to forming backside power rails and signal lines in substantially a same plane across a circuit row such that the signal lines are located at cell boundaries and a via connects a source/drain contact to a backside signal line and a backside contact connects a backside power rail to a source/drain. The backside power rails and signal lines are formed through a multistage processing, where the first stage forms a first trench by removing a sacrificial backside contact placeholder made of SiGe. The second stage fills the first trench with a conductive metal, forming the backside contact. The third stage forms the backside power rails and signal lines within a backside interlayer dielectric layer in substantially the same plane. The fourth stage forms the backside interconnect above the backside power rails and signal lines and the backside interlayer dielectric layer.

FIG. 1 illustrates a top-down view of a plurality of nanodevices ND1, ND2, in accordance with the embodiment of the present invention. The adjacent and parallel devices along the x-axis include a first nanodevice ND1 comprised of a plurality of first transistors, and a second nanodevice ND2 comprised of a plurality of second transistors. Cross-section X is a cross section perpendicular to the gates along the horizontal axis of the second nanodevice ND2. Cross-section $Y_1$ is a cross section parallel to the gates in the source/drain region 102 across the plurality of nanodevices ND1, ND2. Cross-section $Y_2$ is a cross section parallel to the gates in a different source/drain region 104 across the plurality of nanodevices ND1, ND2. It may be appreciated that the embodiment of the present invention is not limited to nanodevices ND1, ND2 and that other devices including, but not limited to, FinFET, nanowire, and a planar device may also be used.

Figure 4:
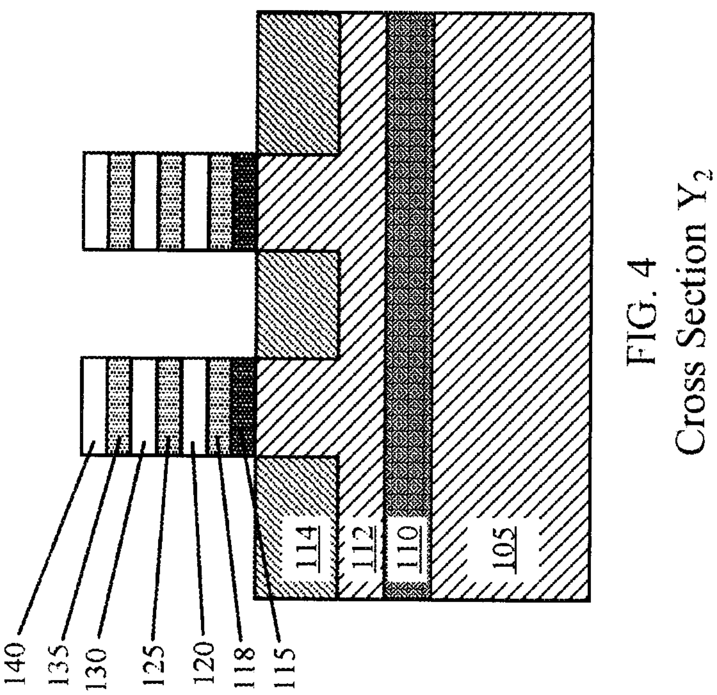
Figure 3:
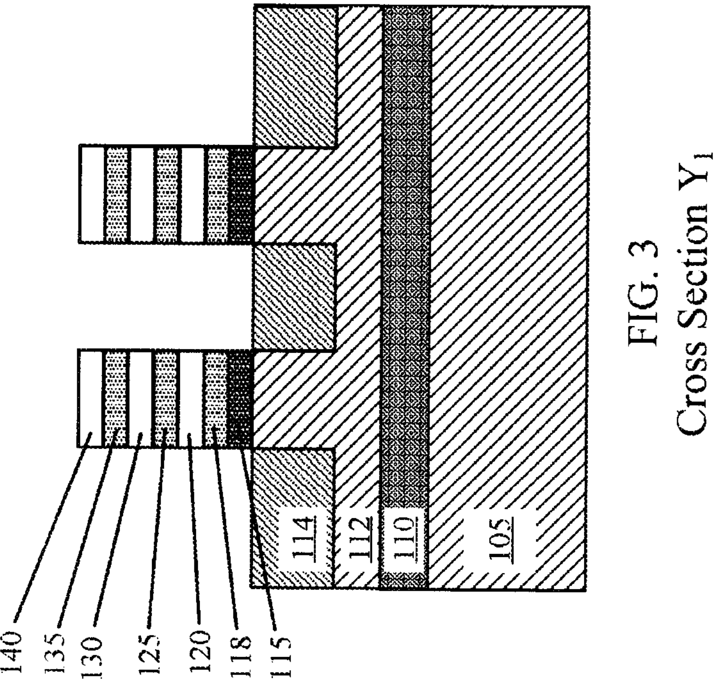

FIGS. 2-4 illustrate cross sections X, $Y_1$, and $Y_2$, respectively, of the plurality of nanodevices ND1, ND2 after nanosheet 120, 130, 140 formation, shallow trench isolation (STI) region 114 formation, dummy gate 145 formation, gate hard mask 150 formation, and etch stop layer 110 formation, in accordance with the embodiment of the present invention. The plurality of nanodevices ND1, ND2 include a substrate 105, an etch stop layer 110, an underlying substrate layer 112, an STI region 114, a first sacrificial layer 115, a second sacrificial layer 118, a first nanosheet 120, a third sacrificial layer 125, a second nanosheet 130, a fourth sacrificial layer 135, a third nanosheet 140, a dummy gate 145, and a gate hard mask 150. The substrate 105 and the etch stop layer 110 can be, for example, a material including, but not necessarily limited to, silicon (Si), silicon germanium (SiGe), Si: C (carbon doped silicon), carbon doped silicon germanium (SiGe: C), III-V, II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or the entire semiconductor substrate 105 may also be comprised of an amorphous, polycrystalline, or monocrystalline. The semiconductor substrate 105 and the etch stop layer 110 may be doped, undoped or contain doped regions and undoped regions therein.

The first sacrificial layer 115 is formed directly atop the underlying substrate layer 112. The second sacrificial layer 118 is formed directly atop the first sacrificial layer 115. The first nanosheet 120 is formed directly atop the second sacrificial layer 118. The third sacrificial layer 125 is formed directly atop the first nanosheet 120. The second nanosheet 130 is formed directly atop the third sacrificial layer 125. The fourth sacrificial layer 135 is formed directly atop the second nanosheet 130. The third nanosheet 140 is formed directly atop the fourth sacrificial layer 135. The dummy gate 145 is formed directly atop the third nanosheet 140. The gate hard mask 150 is formed directly atop the dummy gate 145. The first sacrificial layer 115, the second sacrificial layer 118, the third sacrificial layer 125, and the fourth sacrificial layer 135 are hereinafter referred to as the plurality of sacrificial layers 115, 118, 125, 135. In addition, the first nanosheet 120, the second nanosheet 130, and the third nanosheet 140 are hereinafter referred to as the plurality of nanosheets 120, 130, 140. The plurality of sacrificial layers 115, 118, 125, 135 may be comprised of, for example, SiGe, where Ge is about 35%. The plurality of nanosheets 120, 130, 140 may be comprised of, for example, Si. The number of nanosheets and the number of sacrificial layers described above are not intended to be limiting, and it may be appreciated that in the embodiment of the present invention the number of nanosheets and the number of sacrificial layers may vary. After formation of the plurality of nanosheets 120, 130, 140 and the plurality of sacrificial layers 115, 118, 125, 135, together the nanosheet stack, the nanosheet stack (comprising alternative Si and SiGe layers over a bottom most high Ge % SiGe layer) may be further patterned using conventional lithography and etching processes. After nanosheet stack formation and patterning, the STI region 114 is formed by dielectric filling, CMP, and dielectric recess.

Figure 5:
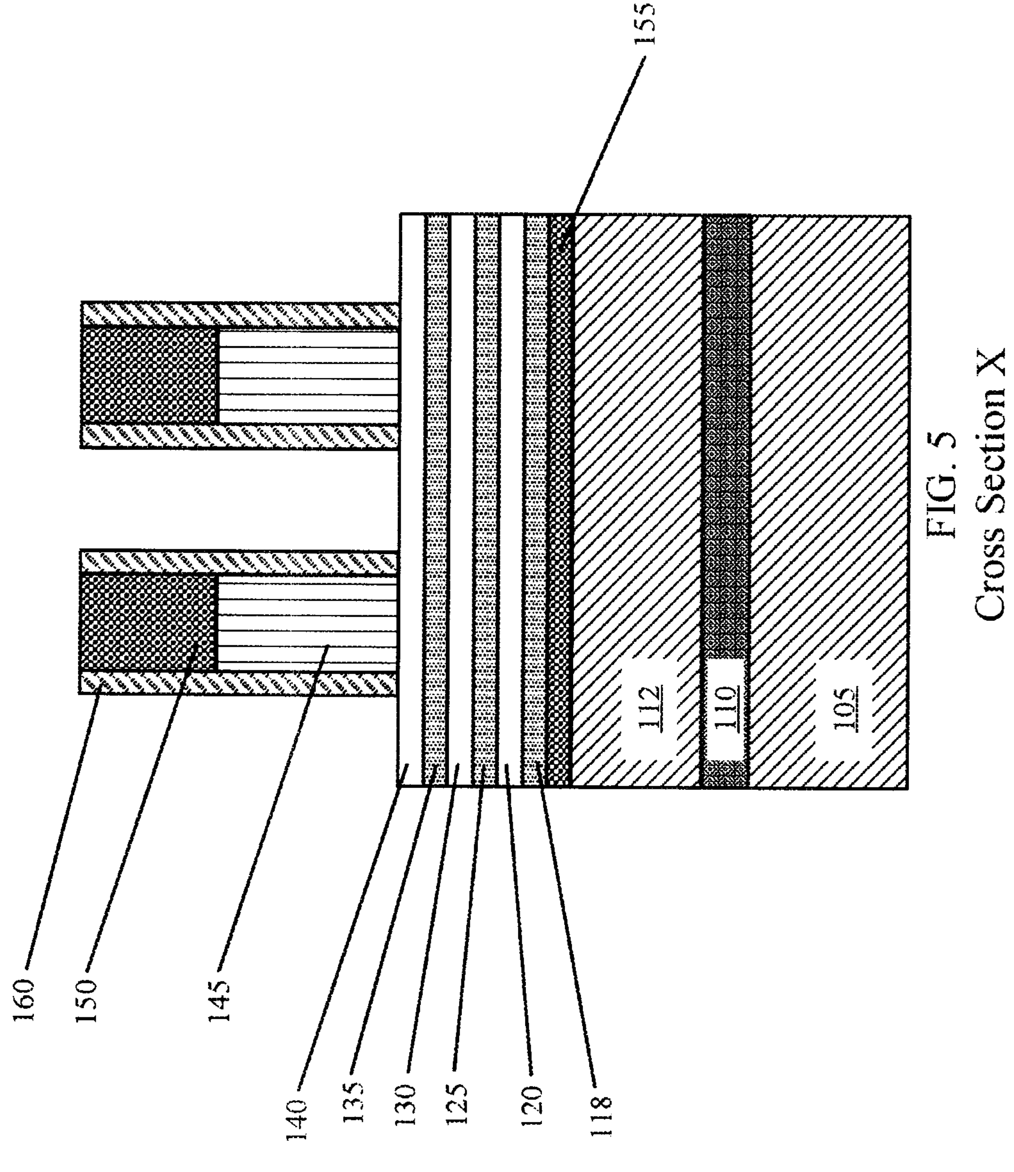
FIGS. 5-7 illustrate cross sections X, $Y_1$, and $Y_2$, respectively, of the plurality of nanodevices after gate spacer and inner spacer formation, bottom dielectric isolation (BDI) layer formation, and reactive ion etching (RIE), in accordance with the embodiment of the present invention.
Figures 6, 7:
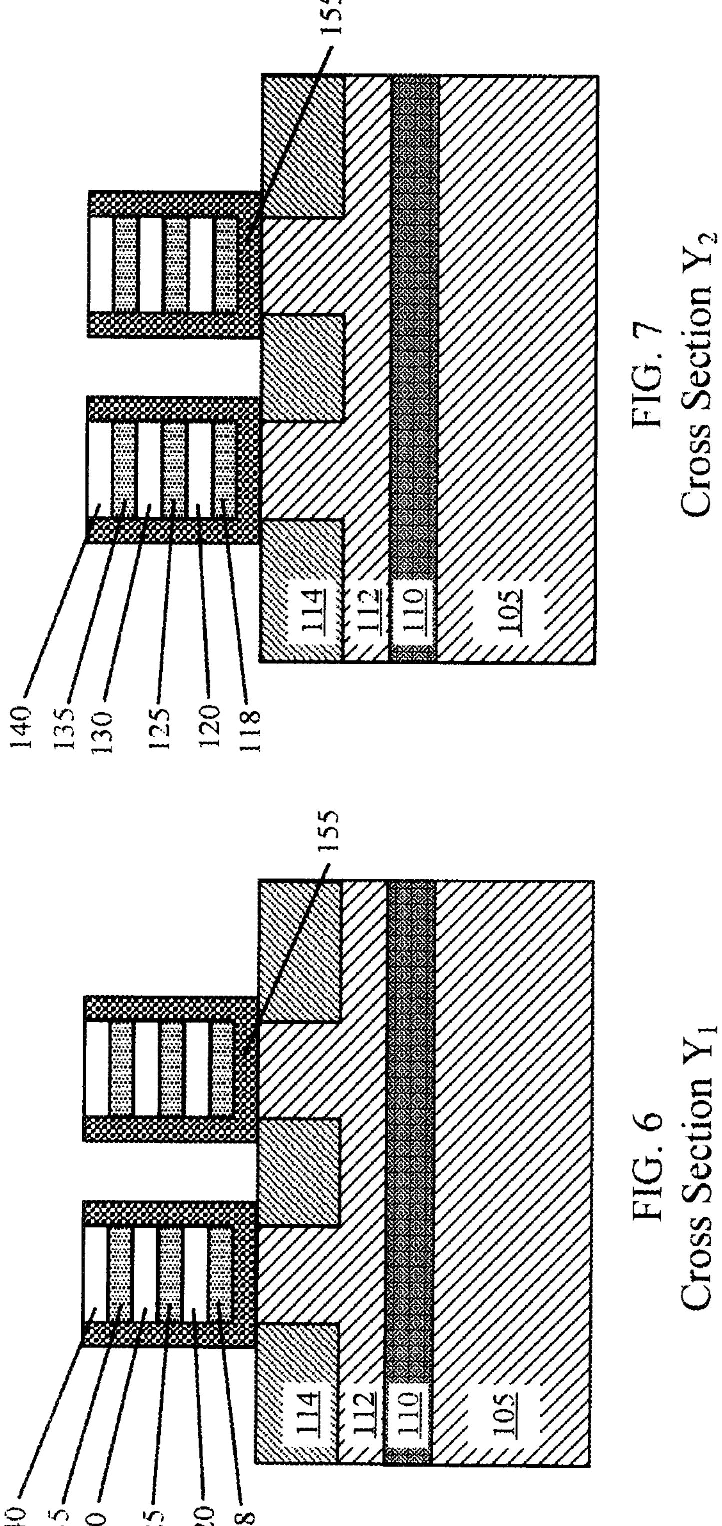

FIGS. 5-7 illustrate cross sections X, $Y_1$, and $Y_2$, respectively, of the plurality of nanodevices ND1, ND2 after gate spacer 160 formation, bottom dielectric isolation (BDI) layer 155 formation, and reactive ion etching (RIE), in accordance with the embodiment of the present invention. The bottom most high Ge % SiGe layer is selectively removed, followed by gate spacer 160 and BDI layer 155 formation by a conformal dielectric liner deposition followed by anisotropic etch. In FIG. 5, the BDI layer 155 is located directly atop the underlying substrate layer 112.

Figure 8:
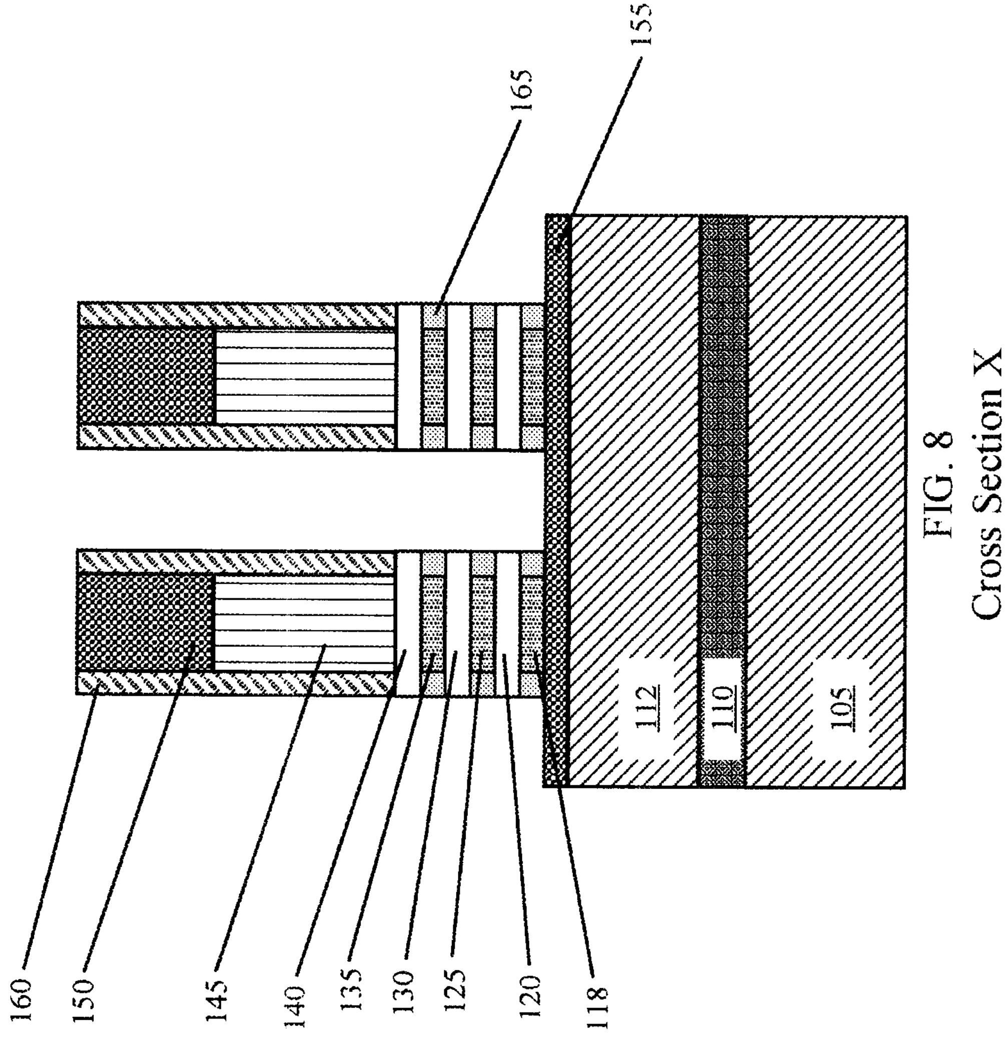
FIGS. 8-10 illustrate cross sections X, $Y_1$, and $Y_2$, respectively, of the plurality of nanodevices after inner spacer formation, in accordance with the embodiment of the present invention.
Figure 10:
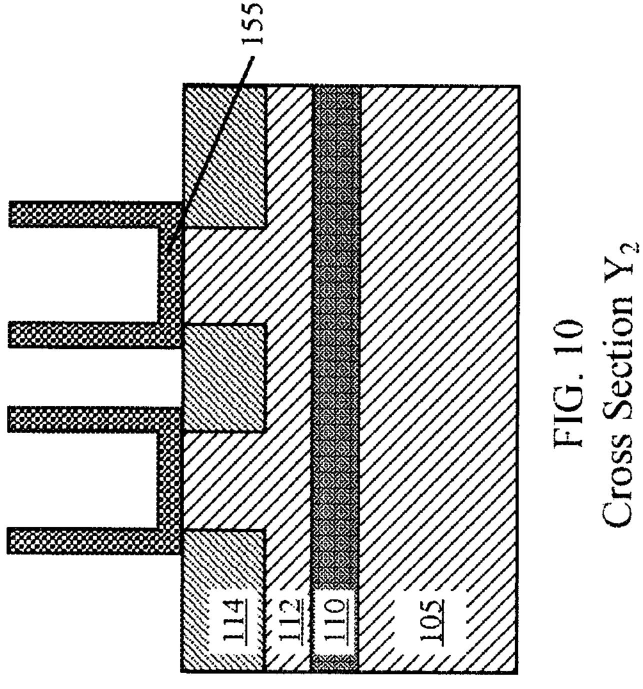
Figure 9:
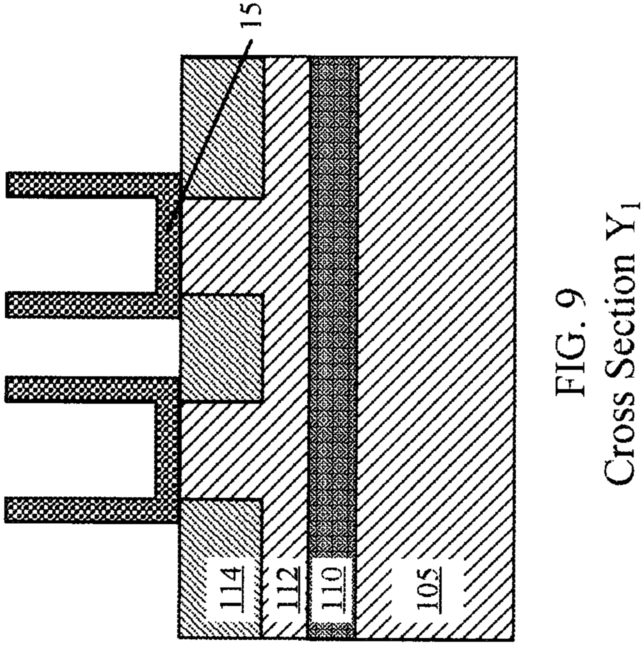

FIGS. 8-10 illustrate cross sections X, $Y_1$, and $Y_2$, respectively, of the plurality of nanodevices ND1, ND2 after inner spacer 165 formation, in accordance with the embodiment of the present invention. The nanosheet stack at the S/D regions 102, 104 are recessed, followed by indentation of sacrificial SiGe and inner spacer 165 formation. In FIGS. 9-10, the BDI layer 155 is located directly atop the underlying substrate layer 112 and between two inner spacers 165. The two inner spacers 165 and the BDI layer 155 form a contiguous unitary structure made of the same or a different dielectric material.

Figure 11:
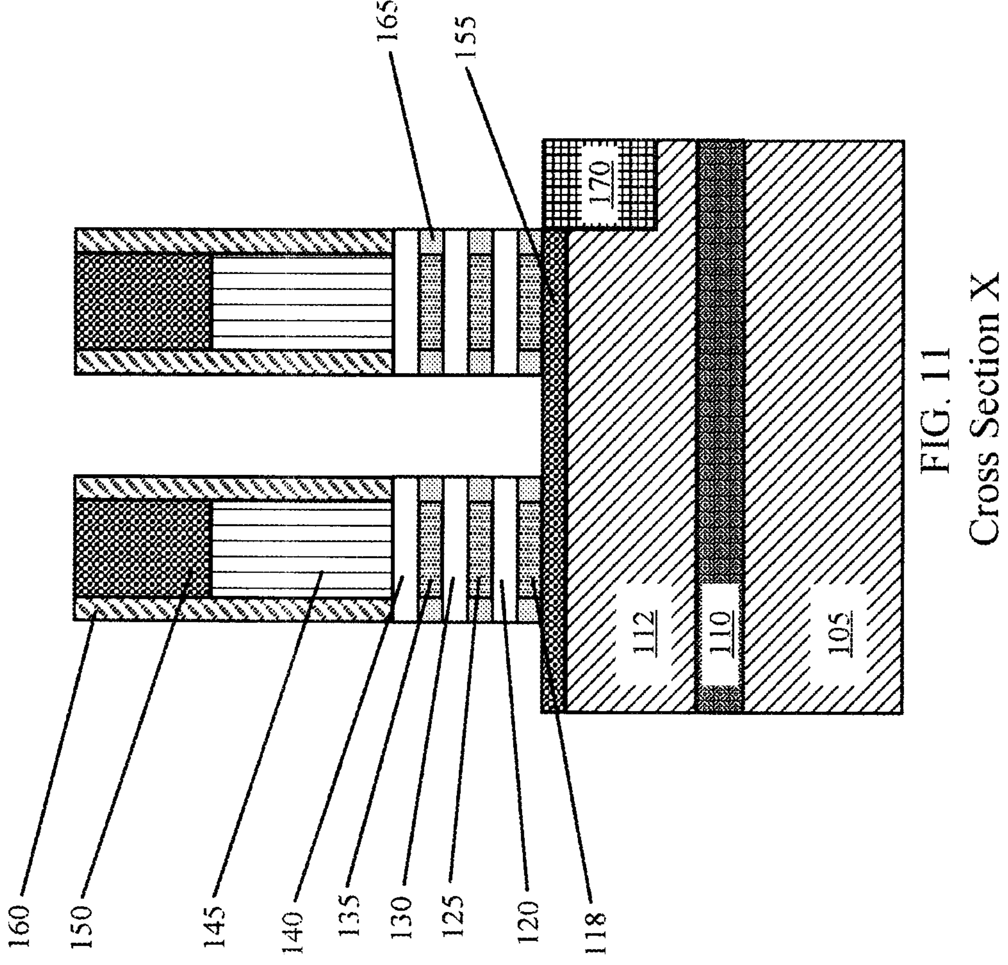
FIGS. 11-13 illustrate cross sections X, $Y_1$, and $Y_2$, respectively, of the plurality of nanodevices after the formation of a sacrificial backside contact placeholder, in accordance with the embodiment of the present invention.
Figure 13:
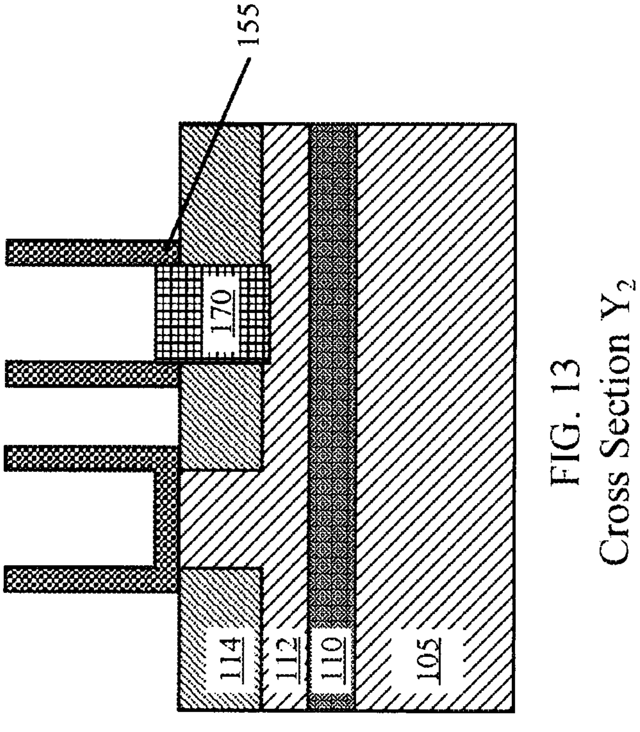
Figure 12:
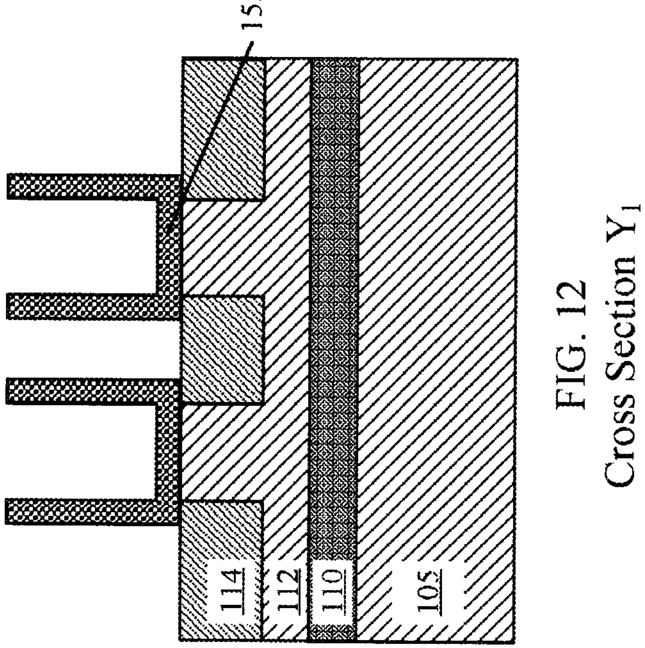

FIGS. 11-13 illustrate cross sections X, $Y_1$, and $Y_2$, respectively, of the plurality of nanodevices ND1, ND2 after the formation of a sacrificial backside contact placeholder 170, in accordance with the embodiment of the present invention. A portion of the BDI layer 155 and the underlying substrate layer 112 are selectively removed and a material (e.g., SiGe) is deposited in a space created by the removal of the portion of the BDI layer 155 and the underlying substrate layer 112 to form the sacrificial backside contact placeholder 170.

Figure 14:
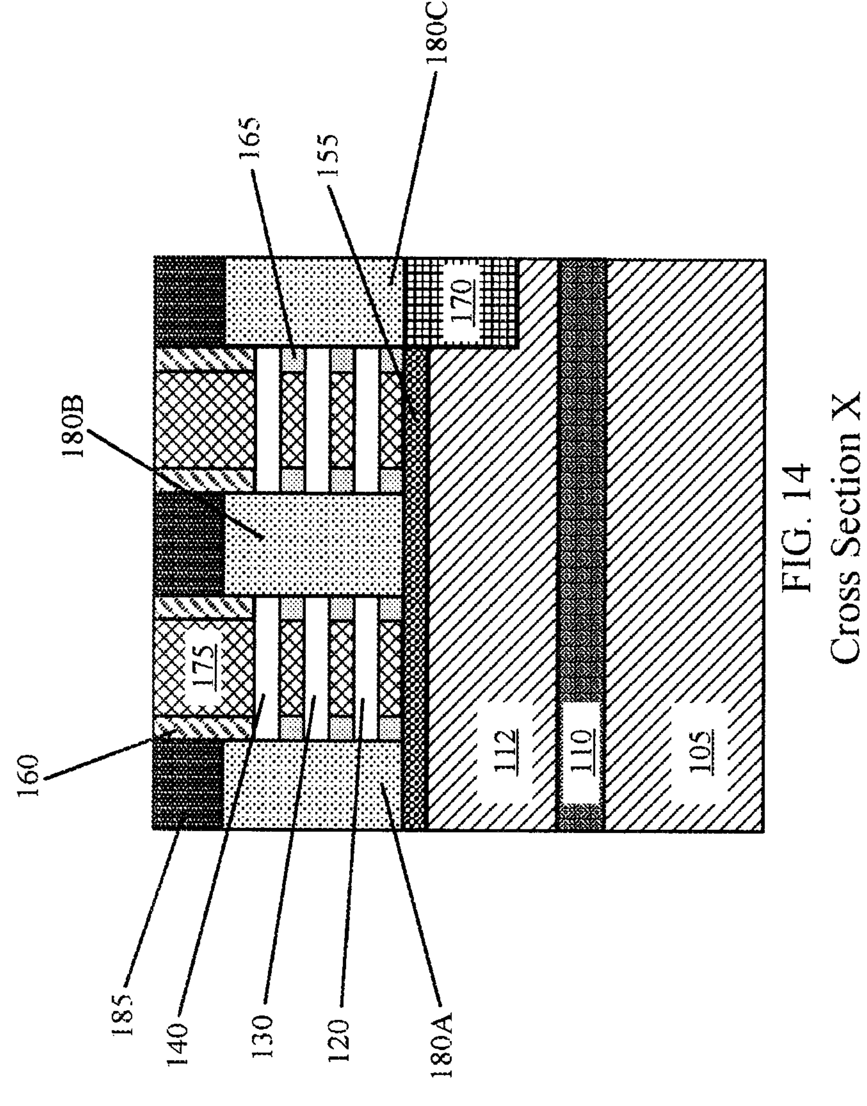
FIGS. 14-16 illustrate cross sections X, $Y_1$, and $Y_2$, respectively, of the plurality of nanodevices after interlayer dielectric (ILD) deposition, chemical-mechanical planarization (CMP), and gate formation and source/drain formation, in accordance with the embodiment of the present invention.
Figures 15, 16:
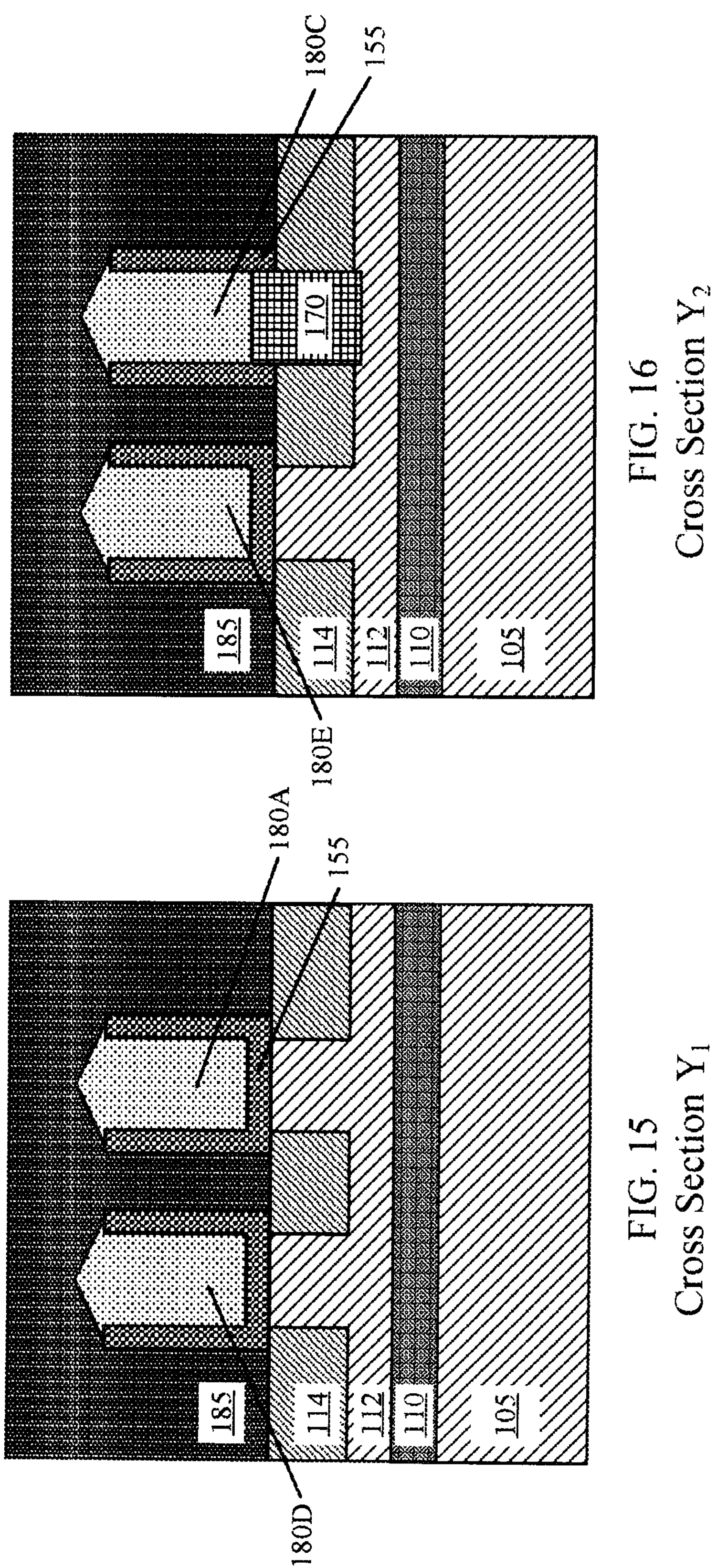

FIGS. 14-16 illustrate cross sections X, $Y_1$, and $Y_2$, respectively, of the plurality of nanodevices ND1, ND2 after interlayer dielectric (ILD) 185 deposition, CMP, and gate 175 formation and source/drain 180A, 180B, 180C, 180D, 180E formation, in accordance with the embodiment of the present invention. The first source/drain 180A, the second source/drain 180B, the third source/drain 180C, the fourth source/drain 180D, and the fifth source/drain 180E are epitaxially grown over exposed sidewalls of the plurality of nanosheets 120, 130, 140, followed by ILD 185 deposition and CMP to remove the gate hard mask 150 and the dummy gate 145. Then, the sacrificial SiGe are removed, followed by gate 175 formation. The first source/drain 180A, the second source/drain 180B, the fourth source/drain 180D, and the fifth source/drain 180E are formed directly atop the BDI layer 155. The third source/drain 180C is formed directly atop the sacrificial backside contact placeholder 170. The first source/drain 180A, the fourth source/drain 180D, and the fifth source/drain 180E are surrounded on three sides by the contiguous unitary structure.

The first source/drain 180A, the second source/drain 180B, the third source/drain 180C, the fourth source/drain 180D, and the fifth source/drain 180E can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

In FIG. 14, the ILD 185 is formed directly atop the first source/drain 180A, the second source/drain 180B, and the third source/drain 180C and surrounds one side of the gate spacer 155. In FIG. 15, the ILD 185 is formed directly atop the first source/drain 180A, the fourth source/drain 180D, the contiguous unitary structure, and the STI region 114. In FIG. 16, the ILD 185 is formed directly atop the third source/drain 180C, the fifth source/drain 180E, the contiguous unitary structure, and the STI region 114.

In FIG. 14, a gate material is deposited in the space created by the removal of the second sacrificial layer 118, the third sacrificial layer 125, and the fourth sacrificial layer 135 and directly atop the third nanosheet 140 to form a replacement gate (i.e., the gate 175). The gate 175 can be comprised of, for example, a gate dielectric liner, such as a high-k dielectric like HfO2, ZrO2, HfLaOx, etc., and work function layers, such as TIN, TiAlC, TiC, etc., and conductive metal fills, like W.

Figure 17:
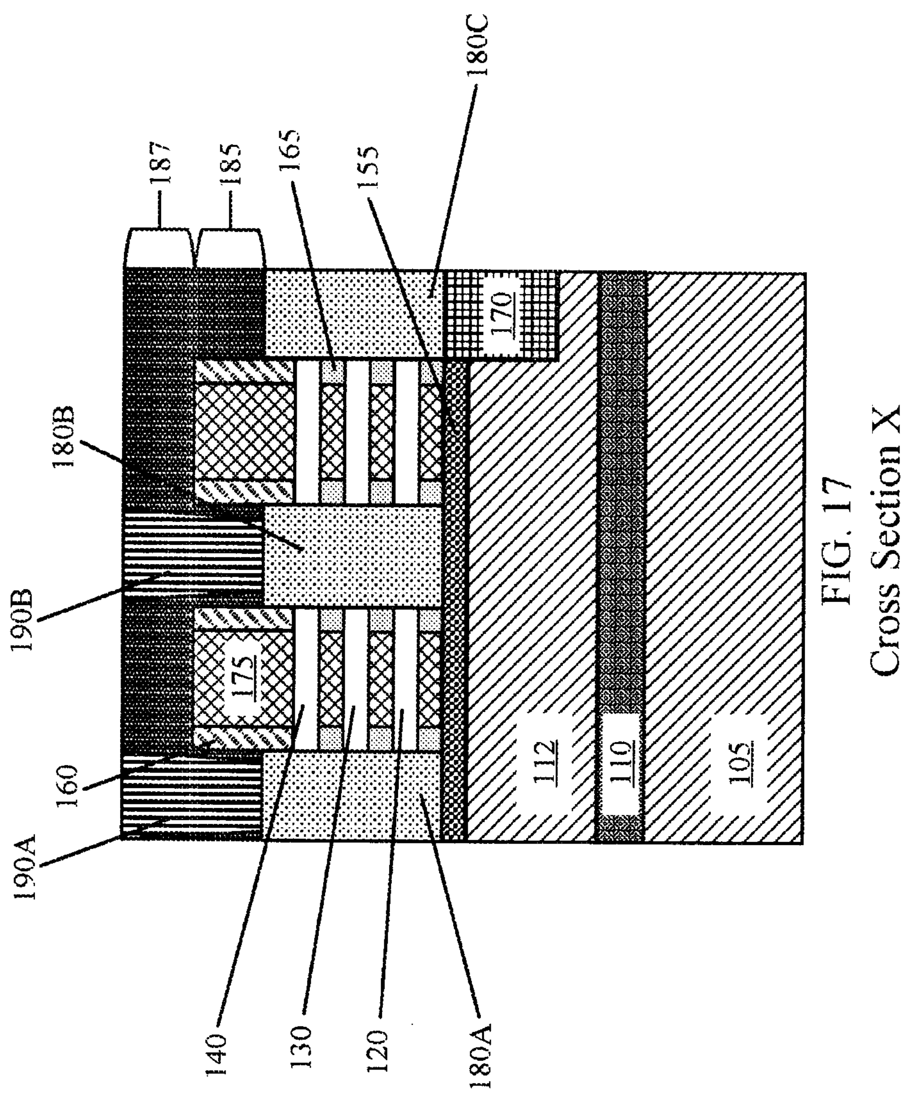
FIGS. 17-19 illustrate cross sections X, $Y_1$, and $Y_2$, respectively, of the plurality of nanodevices after the formation of a via to the backside signal (VBPS) and a plurality of source/drain contacts, in accordance with the embodiment of the present invention.
Figures 18, 19:
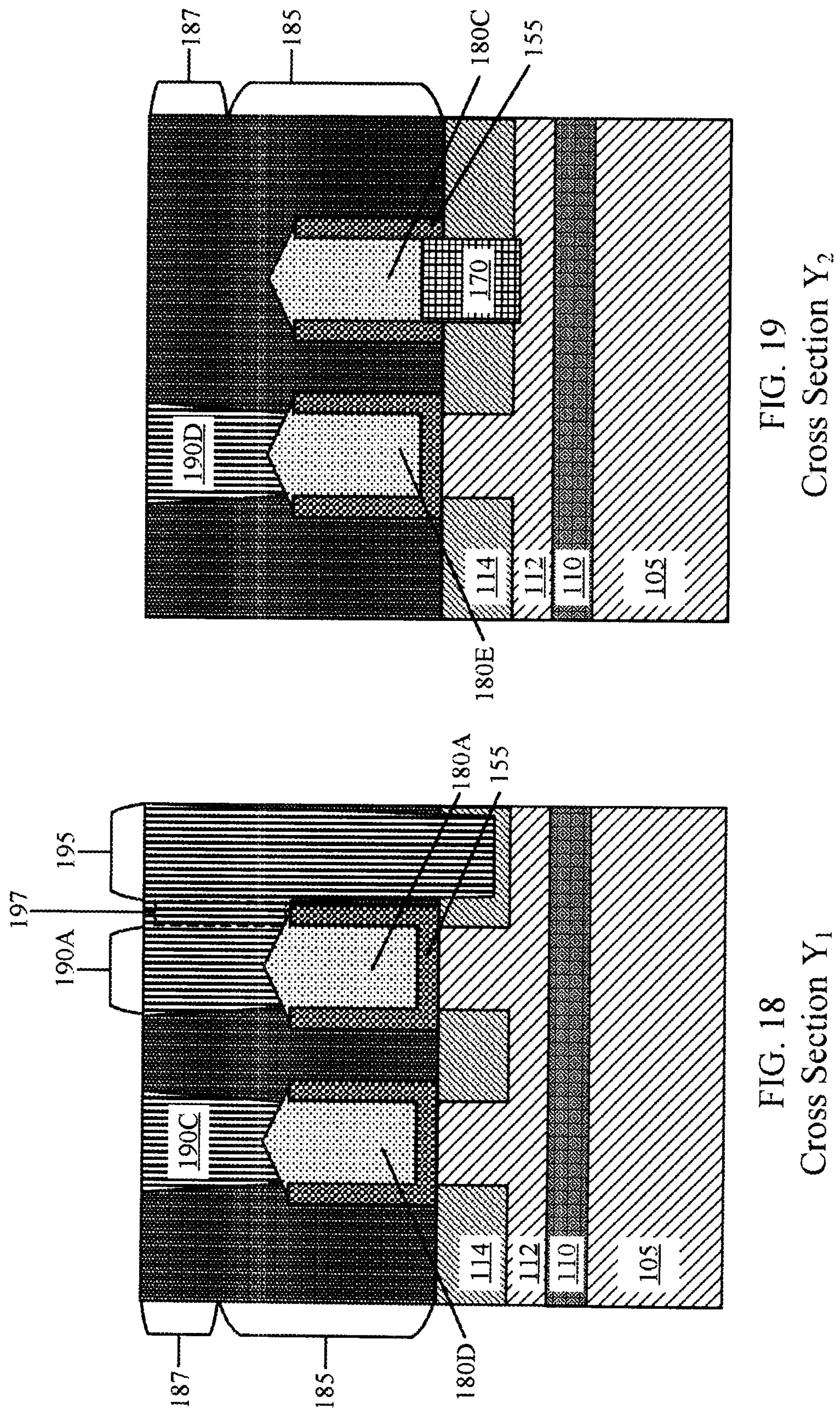

FIGS. 17-19 illustrate cross sections X, $Y_1$, and $Y_2$, respectively, of the plurality of nanodevices ND1, ND2 after the formation of a via to the backside signal (VBPS) 195 and a plurality of source/drain contacts 190A, 190B, 190C, and 190D, in accordance with the embodiment of the present invention. In FIG. 17, an additional ILD 187 is formed directly atop the ILD 185, the gate spacer 160, and the gate 175. The first source/drain contact 190A is located directly atop the first source/drain 180A. The second source/drain contact 190B is located directly atop the second source/drain 180B.

In FIG. 18, the additional ILD 187 is formed directly atop the ILD 185. The first source/drain contact 190A is located directly atop the first source/drain 180A. The third source/drain contact 190C is located directly atop the fourth source/drain 180D. A bottom surface of the VBPS 195 is in contact with the STI region 114. A portion of the sidewalls of the VBPS 195 are in contact with the STI region 114, the ILD 185, or the ILD 185 and the first source/drain contact 190A, respectively. Dashed box 197 illustrates the source/drain contact-VBPS link. The source/drain contact-VBPS link is located between the VBPS 195 and the first source/drain contact 190A. The source/drain contact-VBPS link connects the first source/drain contact 190A to the VBPS 195.

In FIG. 19, the additional ILD 187 is formed directly atop the ILD 185. The fourth source/drain contact 190D is located directly atop the fifth source/drain 180E.

Figure 20:
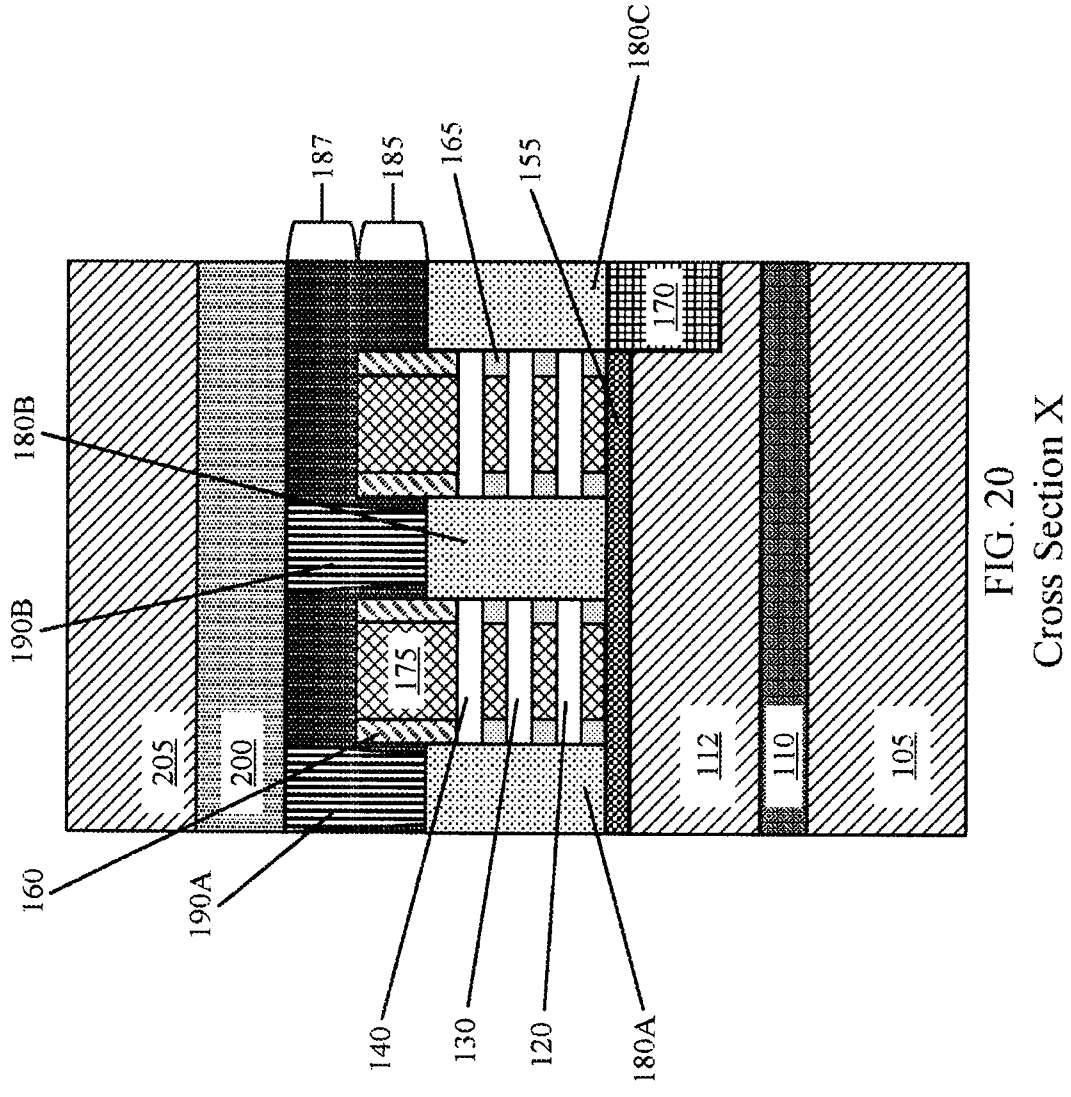
FIGS. 20-22 illustrate cross sections X, $Y_1$, and $Y_2$, respectively, of the plurality of nanodevices after the formation of a back-end-of-line (BEOL) layer and bonding to a carrier wafer, in accordance with the embodiment of the present invention.
Figures 21, 22:
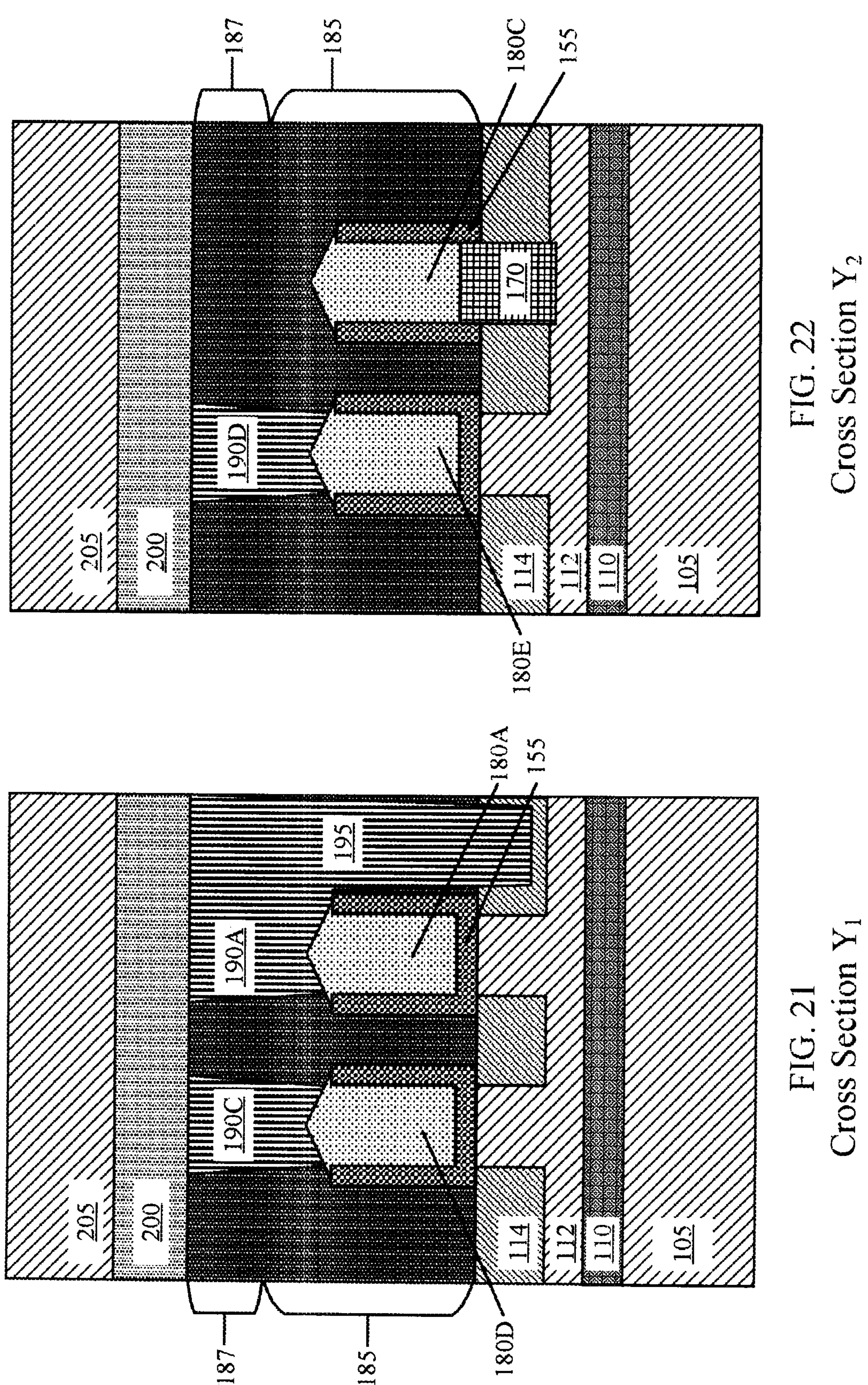

FIGS. 20-22 illustrate cross sections X, $Y_1$, and $Y_2$, respectively, of the plurality of nanodevices ND1, ND2 after the formation of a back-end-of-line (BEOL) layer 200 and bonding to a carrier wafer 205, in accordance with the embodiment of the present invention. The BEOL layer 200 may contain multiple metal layers and vias in between. In FIG. 20, the BEOL layer 200 is formed directly atop the first source/drain contact 190A, the second source/drain contact 190B, and the additional ILD 187. In FIG. 21, the BEOL layer 200 is formed directly atop the first source/drain contact 190A, the third source/drain contact 190C, the VBPS 195, the source/drain contact-VBPS link, and the additional ILD 187. In FIG. 22, the BEOL layer 200 is formed directly atop the fourth source/drain contact 190D and the additional ILD 187. In FIGS. 20-22, the carrier wafer 205 is formed directly atop the BEOL layer 200 by bonding processes (e.g., oxide-oxide bonding).

Figure 23:
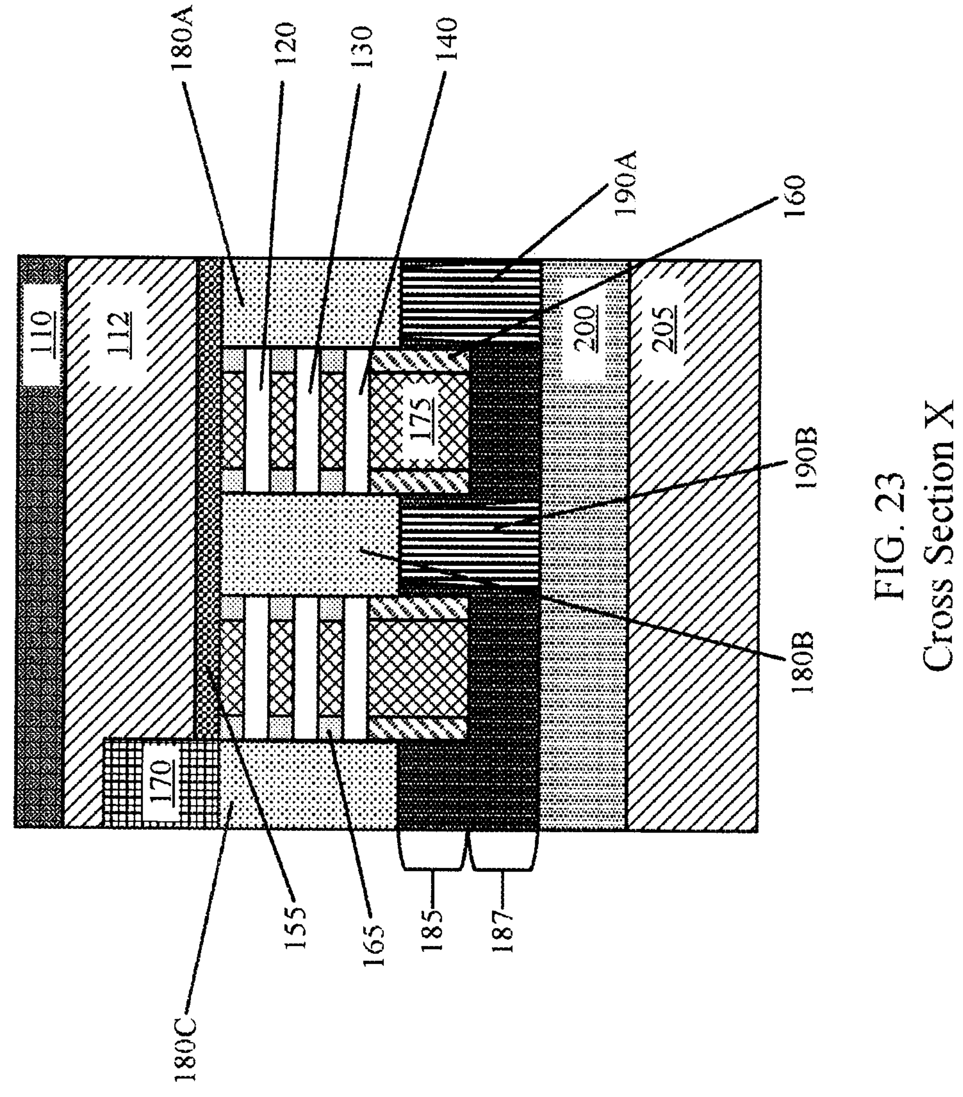
FIGS. 23-25 illustrate cross sections X, $Y_1$, and $Y_2$, respectively, of the plurality of nanodevices after the carrier wafer is flipped and the substrate is removed, in accordance with the embodiment of the present invention.
Figures 24, 25:
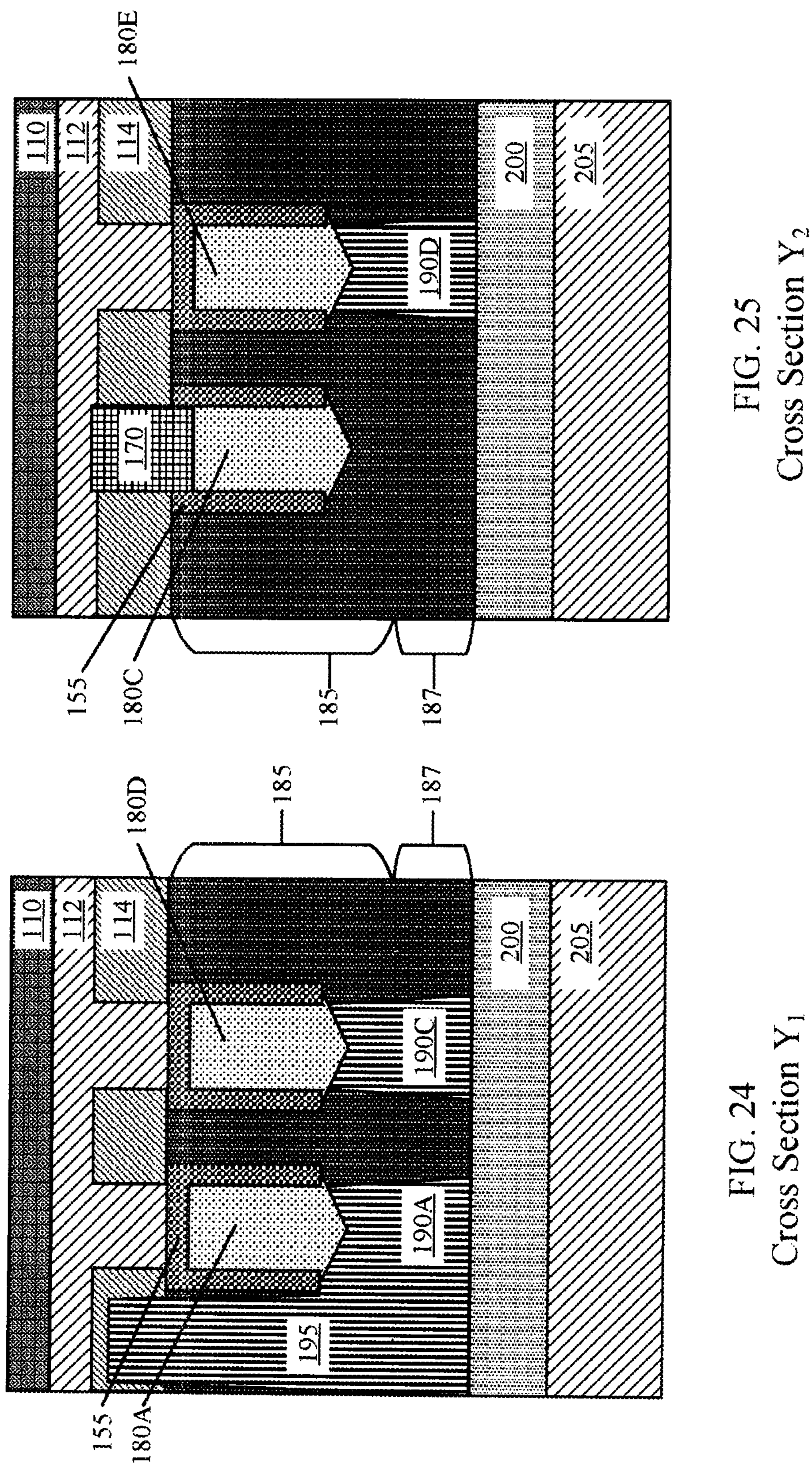

FIGS. 1-22 illustrate the processing of the frontside of the substrate 105, while FIGS. 23-57 illustrate the processing of the backside of the substrate 105. FIGS. 23-25 illustrate cross sections X, $Y_1$, and $Y_2$, respectively, of the plurality of nanodevices ND1, ND2 after the carrier wafer 205 is flipped and the substrate 105 is removed, in accordance with the embodiment of the present invention. The carrier wafer 205 is flipped and the carrier wafer 205 becomes a handler wafer. The substrate 105 is removed by, for example, a combination of processes such as wafer grinding, CMP, and/or selective dry/wet etch, stopping on the etch stop layer 110.

Figure 26:
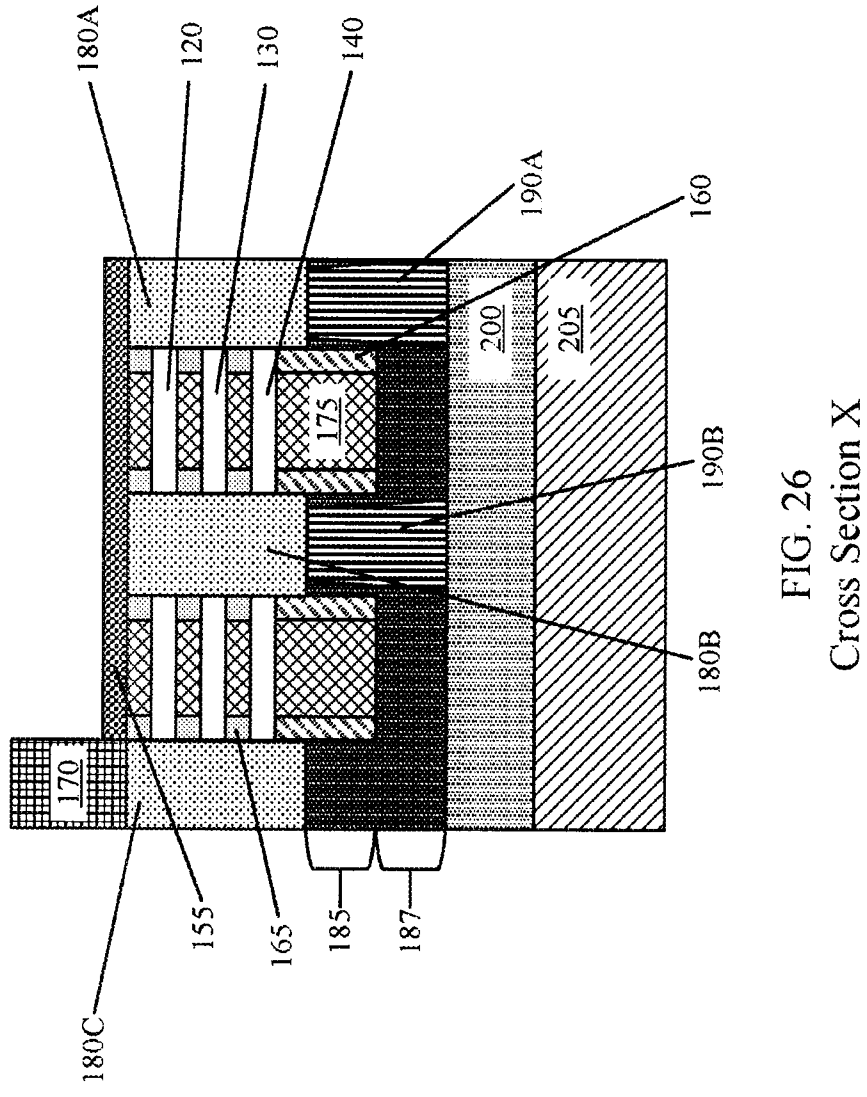
FIGS. 26-28 illustrate cross sections X, $Y_1$, and $Y_2$, respectively, of the plurality of nanodevices after the removal of the etch stop layer and the underlying substrate layer, in accordance with the embodiment of the present invention.
Figures 27, 28:
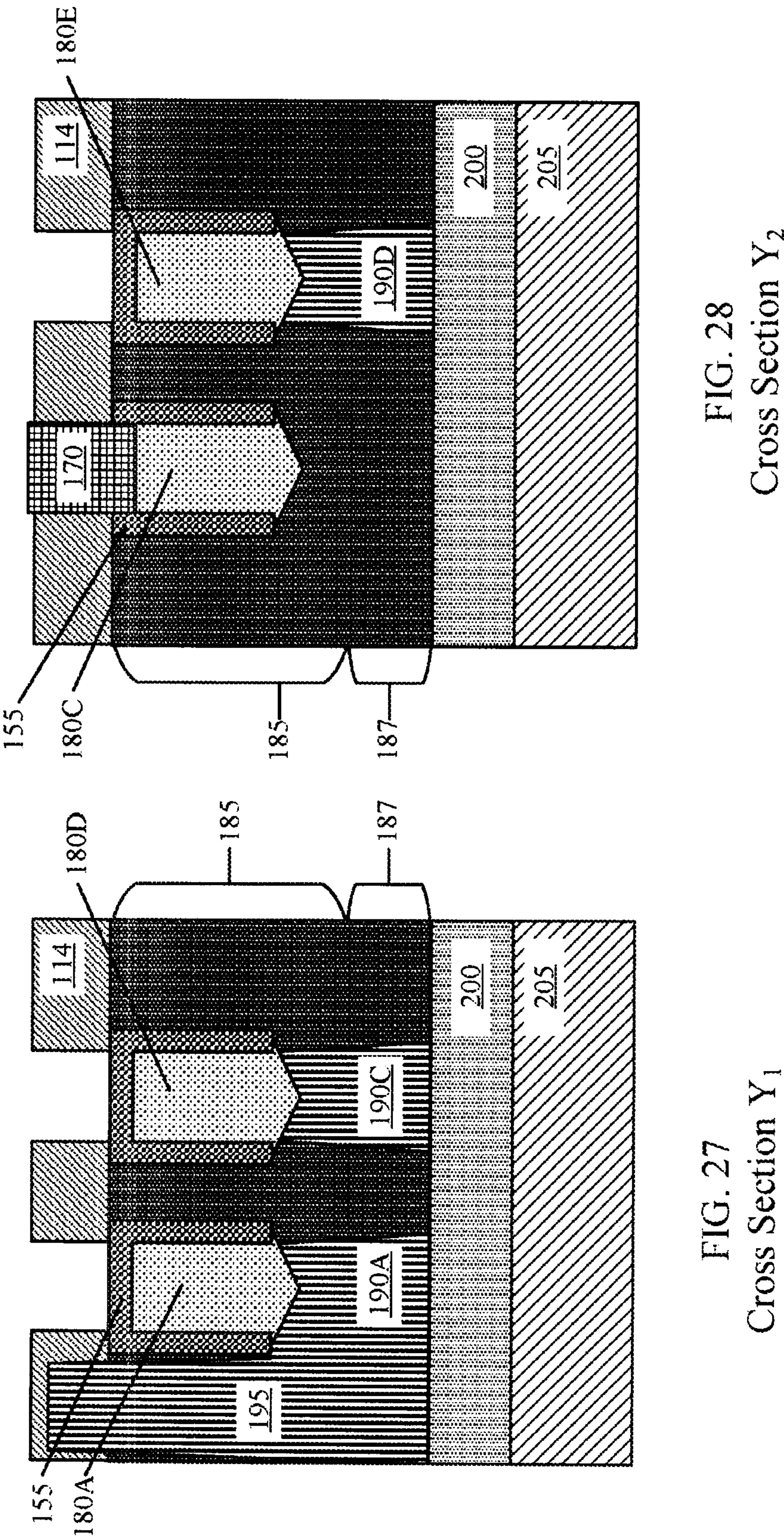

FIGS. 26-28 illustrate cross sections X, $Y_1$, and $Y_2$, respectively, of the plurality of nanodevices ND1, ND2 after the removal of the etch stop layer 110 and the underlying substrate layer 112, in accordance with the embodiment of the present invention. The etch stop layer 110 is removed to expose the underlying substrate layer 112. The underlying substrate layer 112 is removed by, for example, a selective wet or dry etch process.

Figure 29:
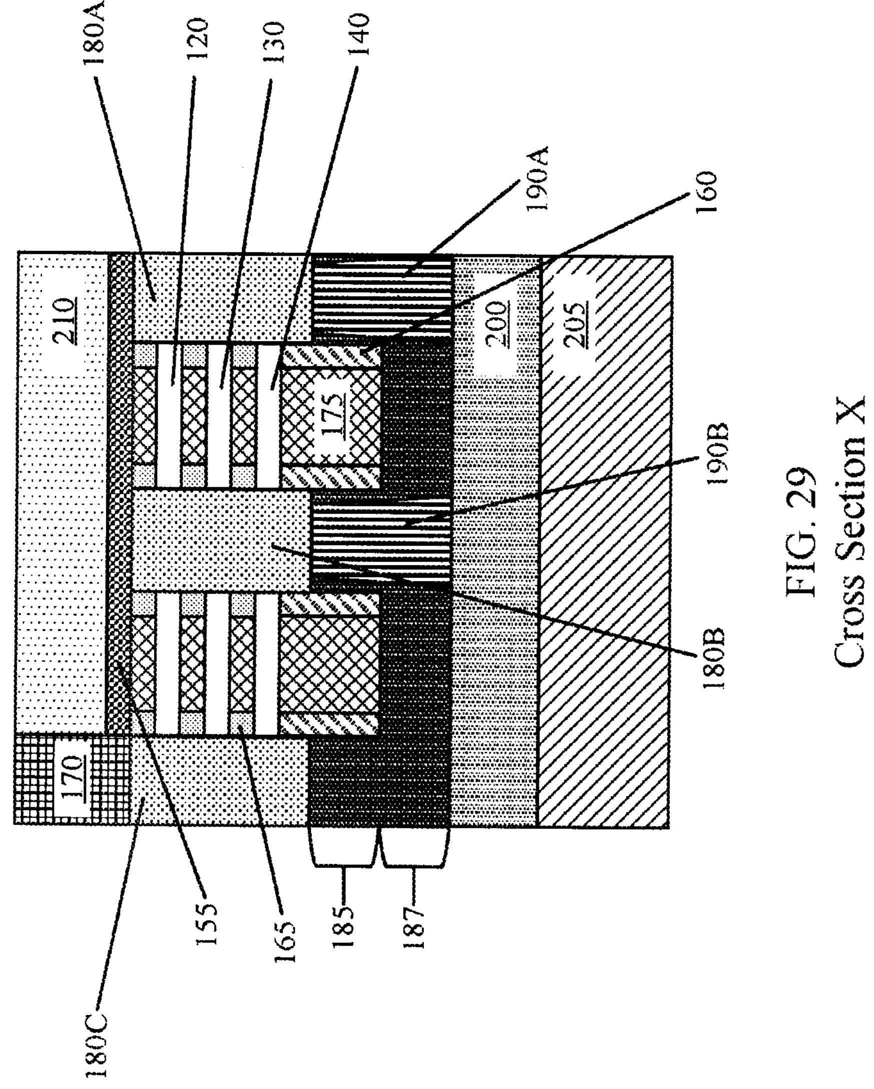
FIGS. 29-31 illustrate cross sections X, $Y_1$, and $Y_2$, respectively, of the plurality of nanodevices after backside ILD (BILD) layer deposition and CMP, in accordance with the embodiment of the present invention.
Figures 30, 31:
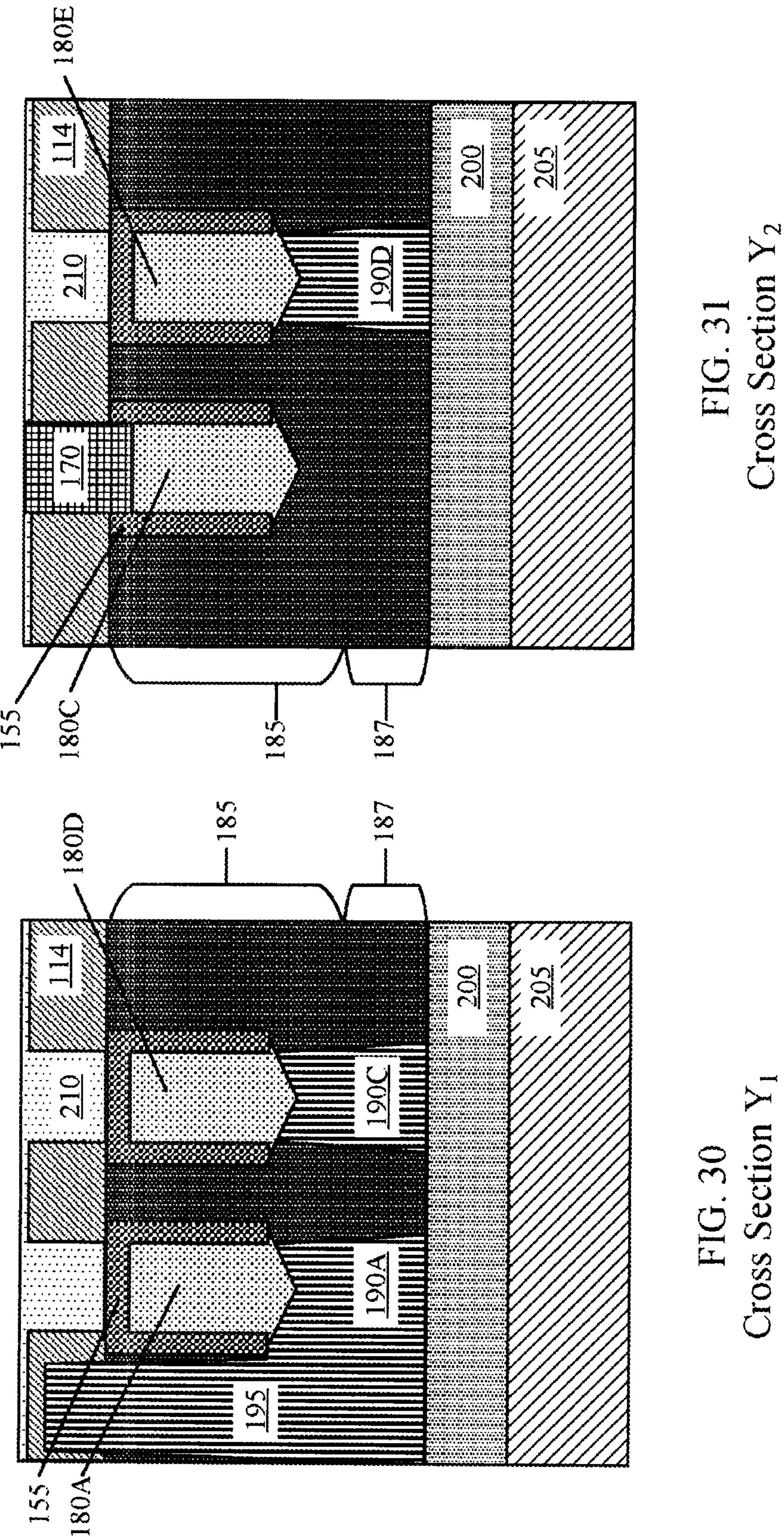

FIGS. 29-31 illustrate cross sections X, $Y_1$, and $Y_2$, respectively, of the plurality of nanodevices ND1, ND2 after backside ILD (BILD) layer 210 deposition and CMP, in accordance with the embodiment of the present invention. In FIG. 29, the BILD layer 210 is deposited directly atop the BDI layer 155 and the sacrificial backside contact placeholder 170. In FIG. 30, the BILD layer 210 is deposited directly atop the BDI layer 155 and the STI region 114. In FIG. 31, the BILD layer 210 is deposited directly atop the BDI layer 155, the STI region 114, and the sacrificial backside contact placeholder 170. In FIGS. 29-31, a portion of the BILD layer 210 is selectively removed by, for example, CMP. A top surface of the sacrificial backside contact placeholder 170 is exposed.

Figure 32:
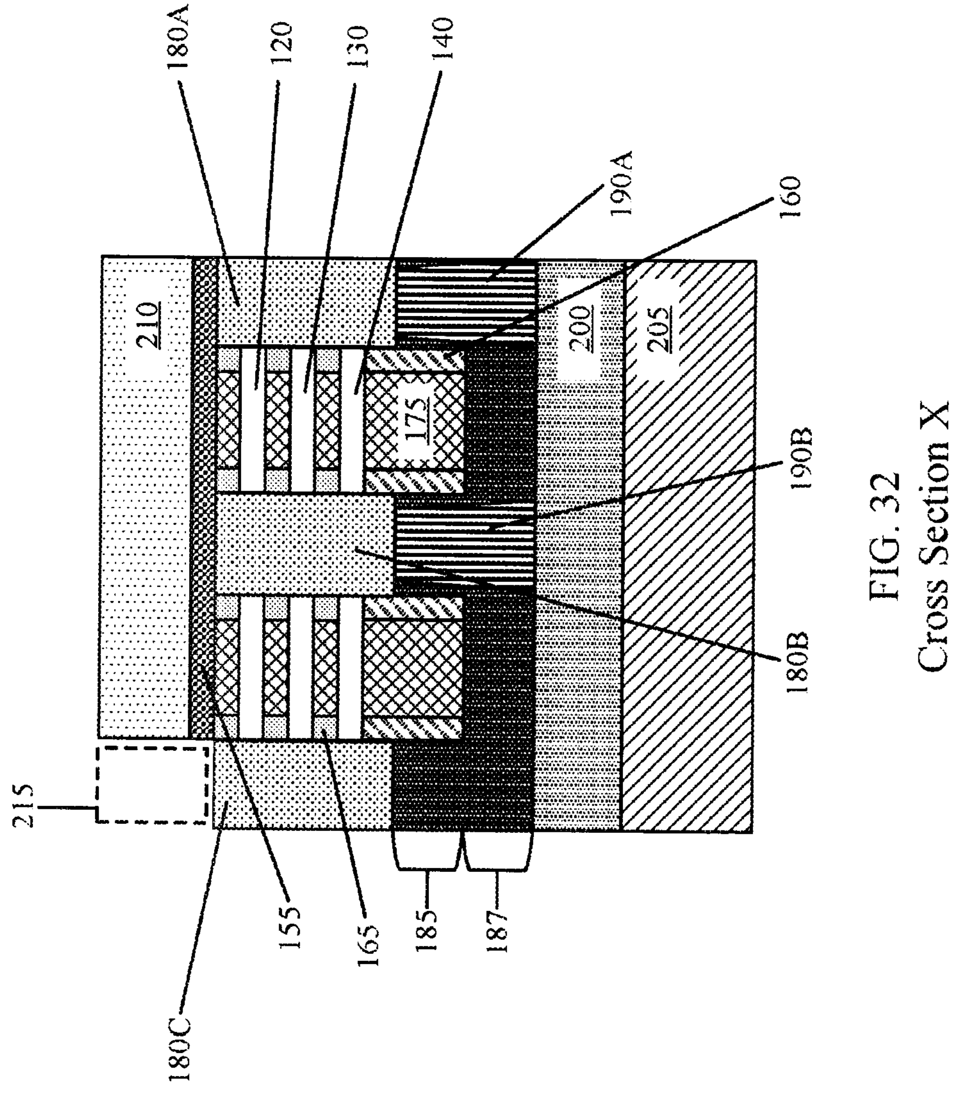
FIGS. 32-34 illustrate cross sections X, $Y_1$, and $Y_2$, respectively, of the plurality of nanodevices after the formation of a trench, in accordance with the embodiment of the present invention.
Figures 33, 34:
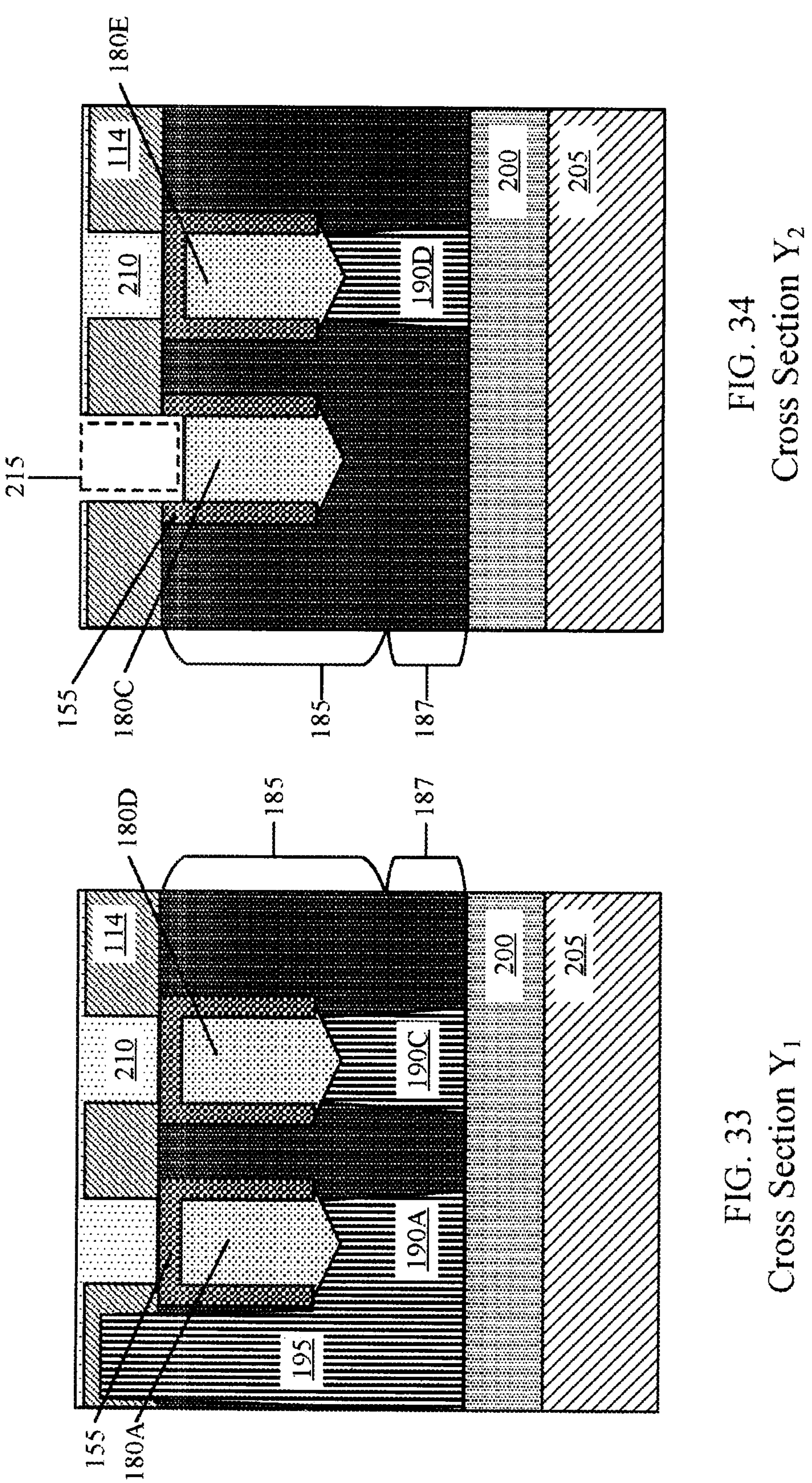

FIGS. 32-34 illustrate cross sections X, $Y_1$, and $Y_2$, respectively, of the plurality of nanodevices ND1, ND2 after the formation of a trench 215, in accordance with the embodiment of the present invention. The sacrificial backside contact placeholder 170 is removed by, for example, CMP to form the trench 215. A bottom surface of the trench 215 exposes a top surface of the third source/drain 180C.

Figure 35:
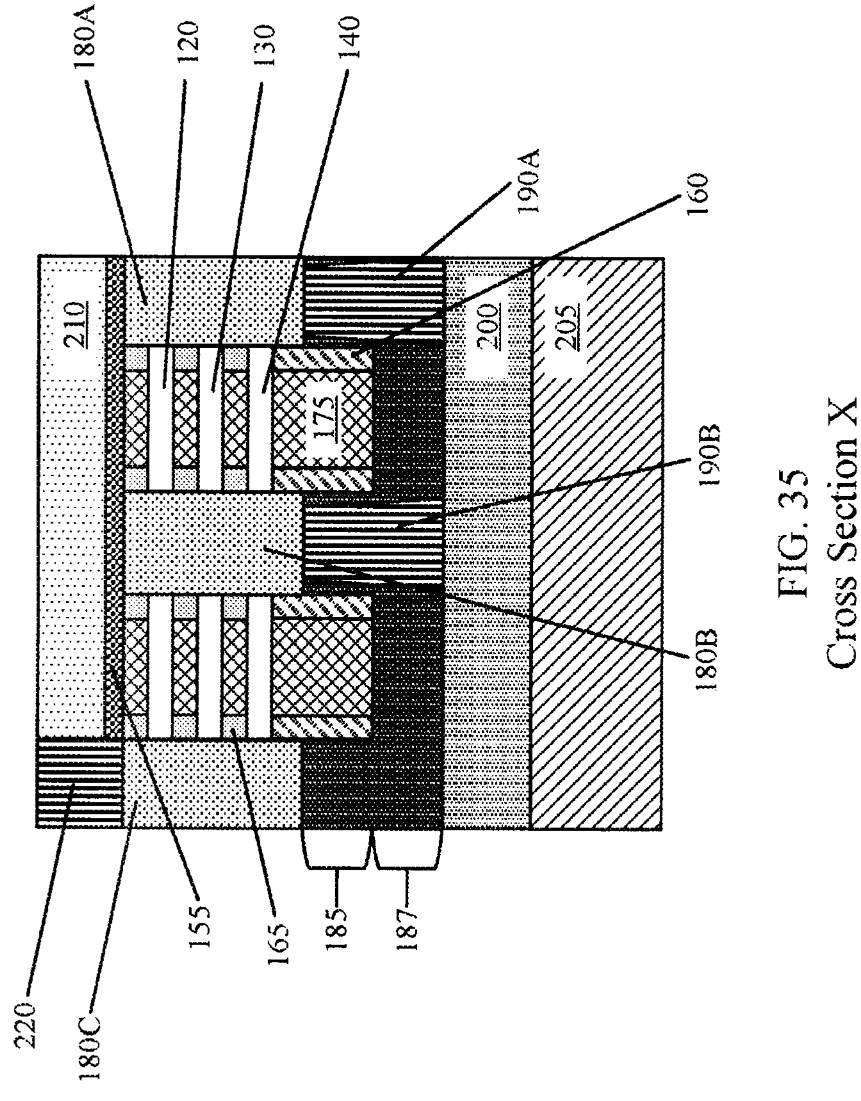
FIGS. 35-37 illustrate cross sections X, $Y_1$, and $Y_2$, respectively, of the plurality of nanodevices after the formation of a backside contact and CMP, in accordance with the embodiment of the present invention.
Figures 36, 37:
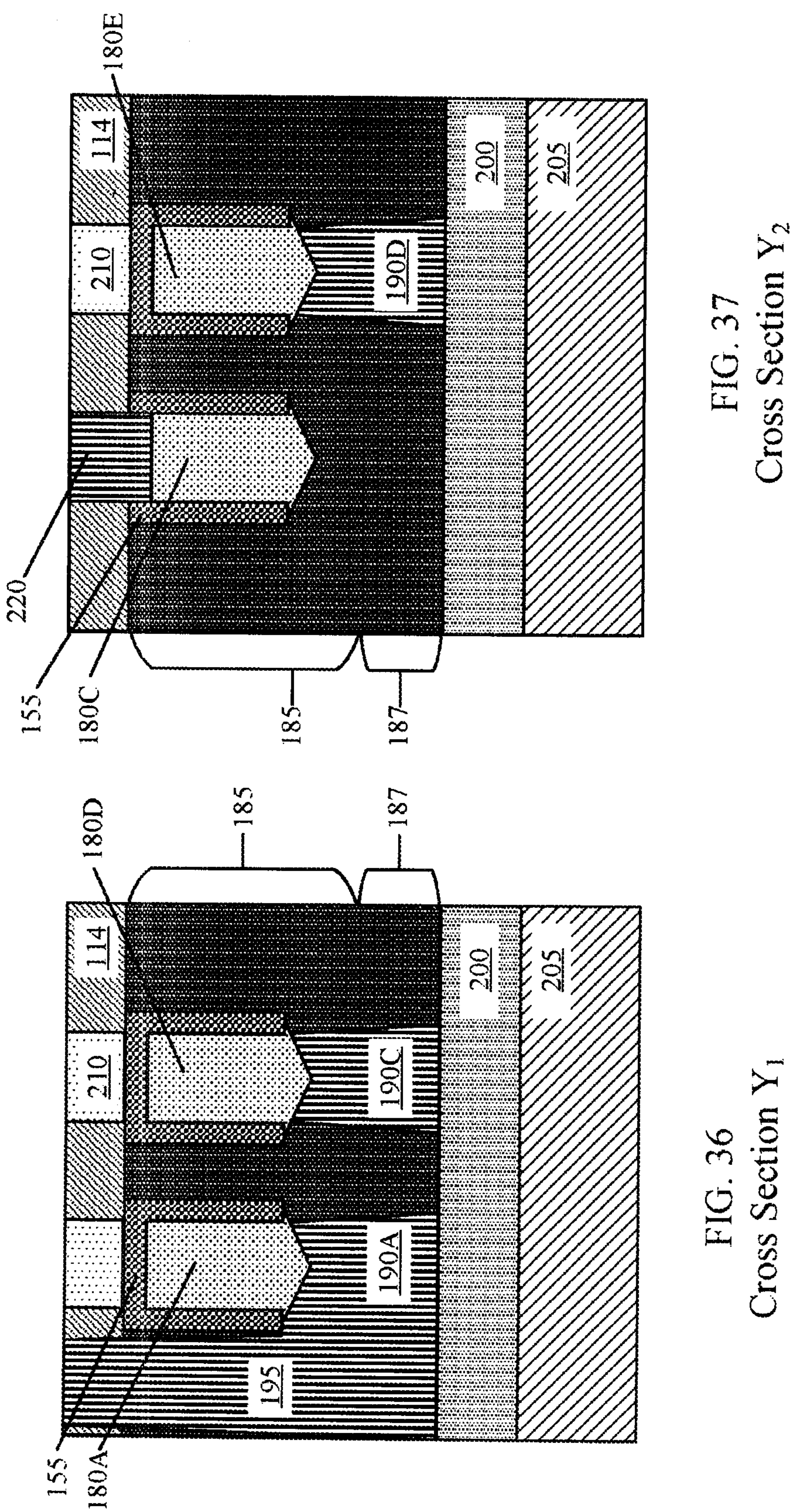

FIGS. 35-37 illustrate cross sections X, $Y_1$, and $Y_2$, respectively, of the plurality of nanodevices ND1, ND2 after the formation of a backside contact 220 and CMP, in accordance with the embodiment of the present invention. The trench 215 is filled with a conductive metal (e.g., including a silicide liner, such as Ni. Ti, NiPt, an adhesion metal liner, such as TiN and conductive metal fill, such as W, Co, or Ru) to form the backside contact 220. Then, a portion of the BILD layer 210 and the STI region 114 are selectively removed by, for example, CMP to expose a top surface of the VBPS 195 and a top surface of the backside contact 220.

Figure 38:
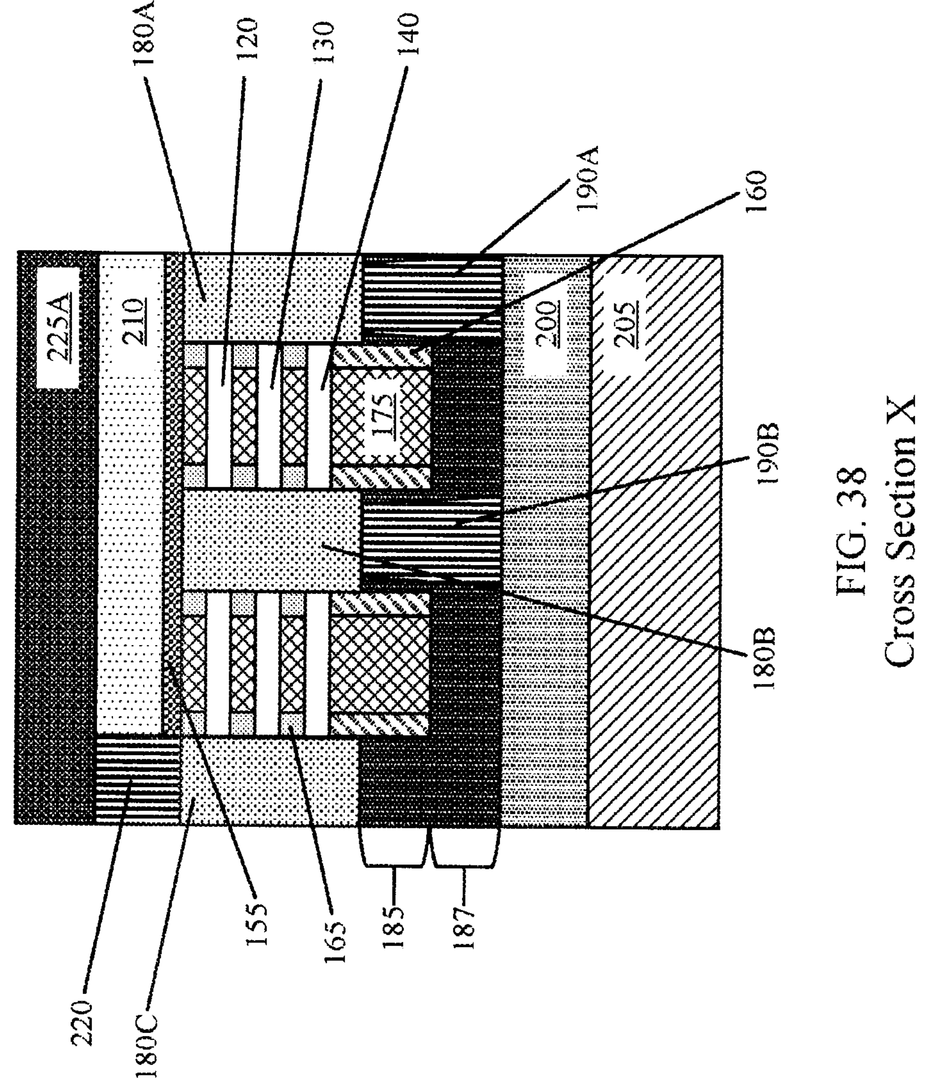
FIGS. 38-40 illustrate cross sections X, $Y_1$, and $Y_2$, respectively, of the plurality of nanodevices after the formation of a plurality of backside power rails (BPRs) and backside signal lines, in accordance with the embodiment of the present invention.
Figures 39, 40:
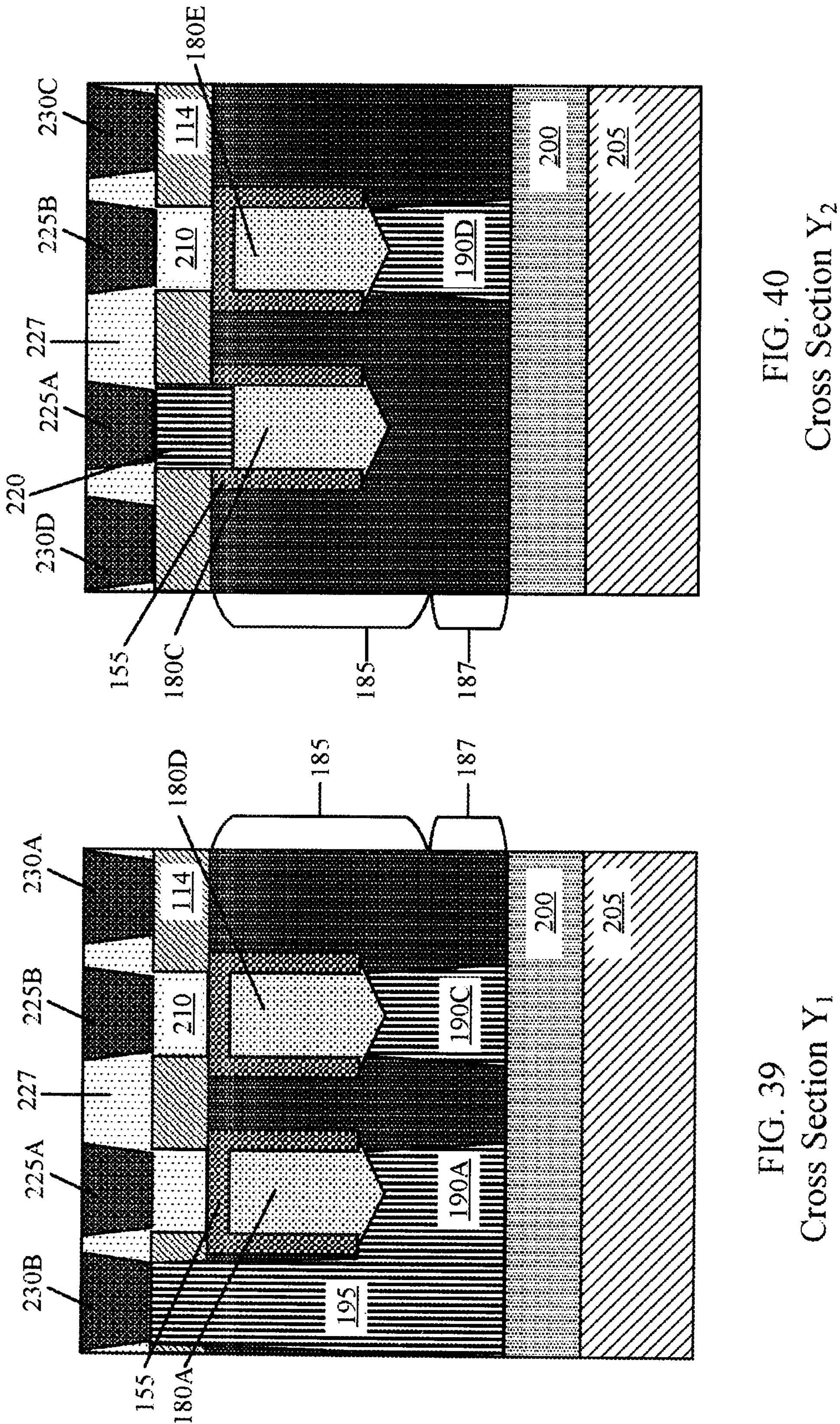

FIGS. 38-40 illustrate cross sections X, $Y_1$, and $Y_2$, respectively, of the plurality of nanodevices ND1, ND2 after the formation of a plurality of backside power rails (BPRs) 225A, 225B and backside signal lines 230A, 230B, 230C, 230D, in accordance with the embodiment of the present invention. The first BPR 225A, the second BPR 225B, the first backside signal line 230A, the second backside signal line 230B, the third backside signal line 230C, and the fourth backside signal line 230D are patterned using conventional lithography and etching processes, followed by metallization (e.g., Cu, Co or Ru fill with adhesion liner such as TiN).

In FIG. 38, the first BPR 225A is formed directly atop the BILD layer 210 and the backside contact 220. A top surface of backside contact 220 is connected to the first BPR 225A.

In FIG. 39, an additional BILD layer 227 is deposited directly atop the BILD layer 210, the VBPS 195, and the STI region 114. The first BPR 225A and the second BPR 225B are formed directly atop the BILD layer 210. A bottom surface of the first BPR 225A and the second BPR 225B are in direct contact with the BILD layer 210. The sidewalls of the first BPR 225A and the second BPR 225B are in direct contact with the additional BILD layer 227. The first backside signal line 230A is formed directly atop the STI region 114. The second backside signal line 230B is formed directly atop the VBPS 195. A bottom surface of the second backside signal line 230B is connected to the VBPS 195. The first source/drain contact 190A (i.e., the source/drain contact in the claims) includes the VBPS 195. The VBPS 195 extends downwards to connect to a frontside of the second backside signal line 230B (i.e., the third backside signal line in the claims). The first source/drain 180A (i.e., the source/drain in the claims) is in direct contact with a backside of the first source/drain contact 190A. The second backside signal line 230B is connected to the first source/drain 180A by the VBPS 195. The sidewalls of the first backside signal line 230A and the second backside signal line 230B are in direct contact with the additional BILD layer 227.

In FIG. 40, the additional BILD layer 227 is deposited directly atop the BILD layer 210, the backside contact 220, and the STI region 114. The first BPR 225A is formed directly atop the backside contact 220. The top surface of the backside contact 220 is connected to the first BPR 225A. The second BPR 225B is formed directly atop the BILD layer 210. A bottom surface of the second BPR 225B is in direct contact with the BILD layer 210. The sidewalls of the first BPR 225A and the second BPR 225B are in direct contact with the additional BILD layer 227. The third backside signal line 230C and the fourth backside signal line 230D are formed directly atop the STI region 114. The sidewalls of the third backside signal line 230C and the fourth backside signal line 230D are in direct contact with the additional BILD layer 227. In FIGS. 39-40, the first BPR 225A, the second BPR 225B, and the plurality of backside signal lines 230A, 230B, 230C, 230D are substantially in a same plane.

Figure 41:
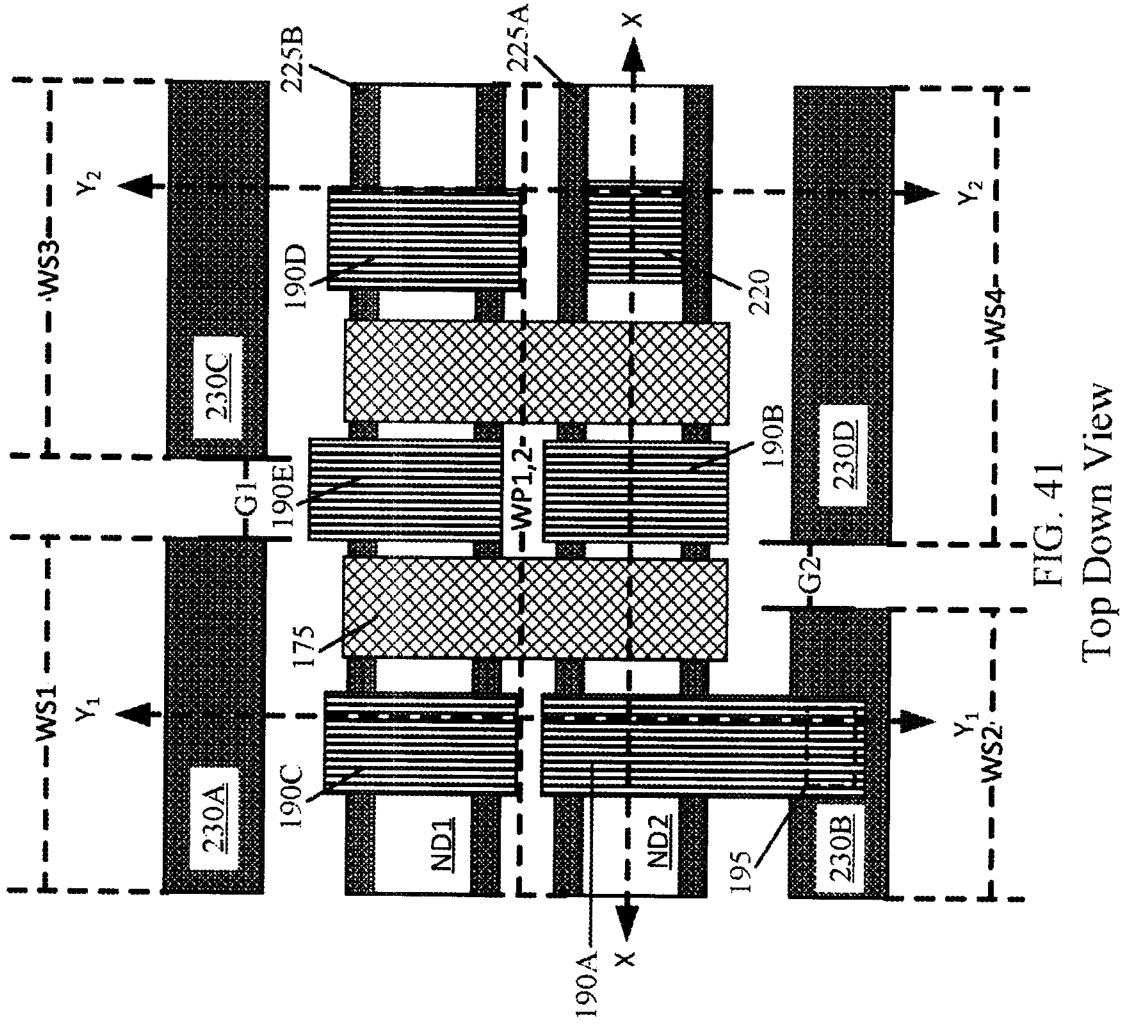
FIG. 41 illustrates a top-down view of the plurality of nanodevices after the formation of the VBPS, the plurality of source/drain contacts, the backside contact, the plurality of BPRs, and the plurality of backside signal lines, in accordance with the embodiment of the present invention.

FIG. 41 illustrates a top-down view of the plurality of nanodevices ND1, ND2 after the formation of the VBPS 195, the plurality of source/drain contacts 190A, 190B, 190C, 190D, 190E, the backside contact 220, the plurality of BPRs 225A, 225B, and the plurality of backside signal lines 230A, 230B, 230C, 230D, in accordance with the embodiment of the present invention. FIG. 41 is meant to illustrate the final structure of the semiconductor device. The second nanodevice ND2 includes the first source/drain contact 190A (i.e., the source/drain contact in the claims), the second source/drain contact 190B, and the backside contact 220. The first nanodevice ND1 includes the third source/drain contact 190C, the fourth source/drain contact 190D, and a fifth source/drain contact 190E. The second source/drain contact 190B and the fifth source/drain contact 190E are located between two gates 175. The first BPR 225A is located adjacent to and parallel to the first backside signal line 230A and the third backside signal line 230C along the x-axis. The second BPR 225B is located adjacent to and parallel to the second backside signal line 230B and the fourth backside signal line 230D along the x-axis. The first backside signal line 230A and the third backside signal line 230C (i.e., the second backside signal line in the claims) are located at a cell boundary of the first nanodevice ND1. The second backside signal line 230B (i.e., the third backside signal line in the claims) and the fourth backside signal line 230D are located at a cell boundary of the second nanodevice ND2. The first BPR 225A and the second BPR 225B are located between the first backside signal line 230A, the second backside signal line 230B, the third backside signal line 230C, and the fourth backside signal line 230D. The first BPR 225A, the second BPR 225B, the first backside signal line 230A, the second backside signal line 230B, the third backside signal line 230C, and the fourth backside signal line 230D are substantially in a same plane.

A first gap G1 exists between the first backside signal line 230A and the third backside signal line 230C. A second gap G2 exists between the second backside signal line 230B and the fourth backside signal line 230D. A width of the first gap G1 parallel to the x-axis is from 5 nanometers (nm) to 100 nm. A width of the second gap G2 parallel to the x-axis is equivalent to the width of the first gap G1 parallel to the x-axis. A width WP1 of the first BPR 225A and a width WP2 of the second BPR 225B parallel to the x-axis is greater than a width WS1 of the first backside signal line 230A, a width WS2 of the second backside signal line 230B, a width WS3 of the third backside signal line 230C, and a width WS4 of the fourth backside signal line 230D parallel to the x-axis. The width WP1 of the first BPR 225A parallel to the x-axis is equivalent to the width WP2 of the second BRR 225B parallel to the x-axis. The width WP1 of the first BPR 225A and the width WP2 of the second BRP 225B parallel to the x-axis is from 40 nm to 2 microns. The width WS1 of the first backside signal line 230A, the width WS2 of the second backside signal line 230B, the width WS3 of the third backside signal line 230C, and the width WS4 of the fourth backside signal line 230D parallel to the x-axis is from 20 nm to 400 nm.

Figure 42:
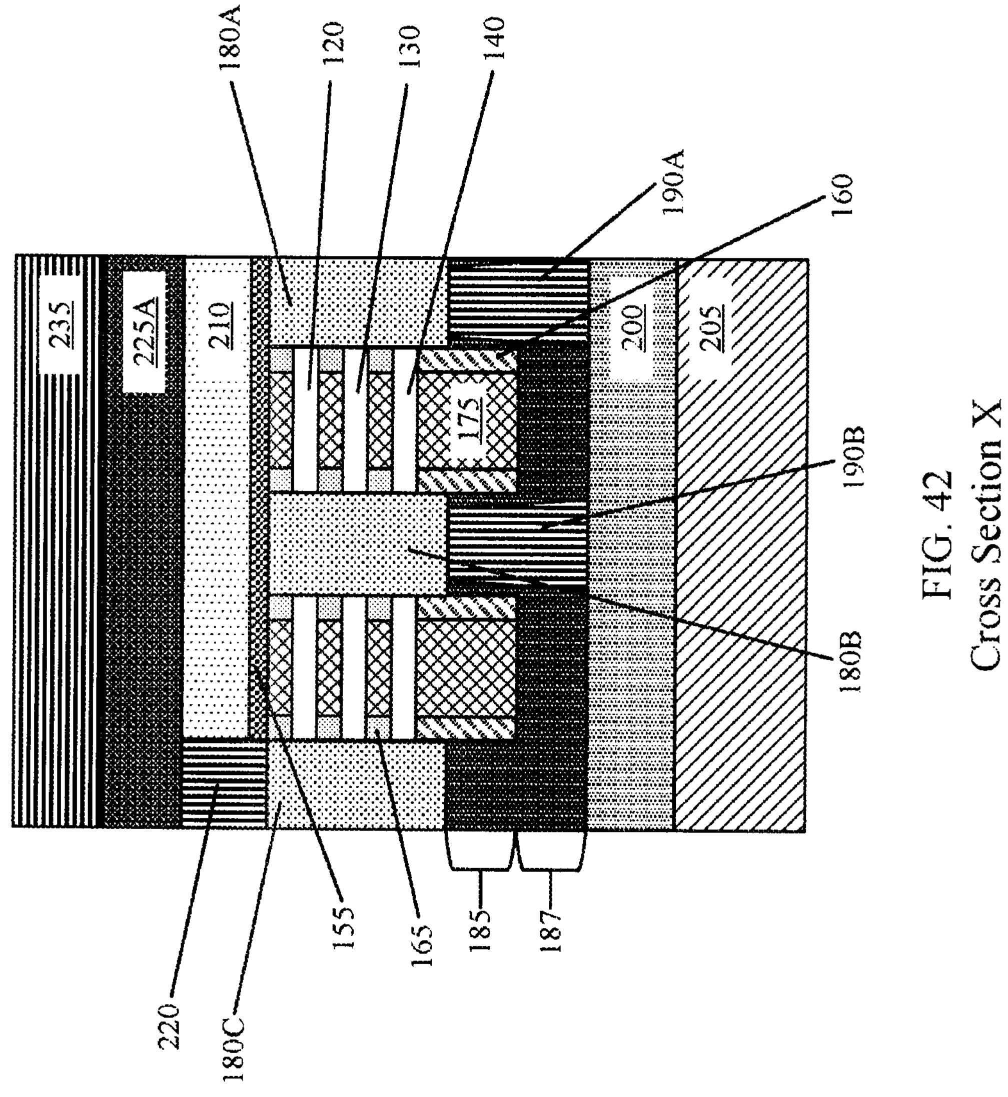
FIGS. 42-44 illustrate cross sections X, $Y_1$, and $Y_2$, respectively, of the plurality of nanodevices after the formation of a backside power distribution network (BSPDN), in accordance with the embodiment of the present invention.
Figures 43, 44:
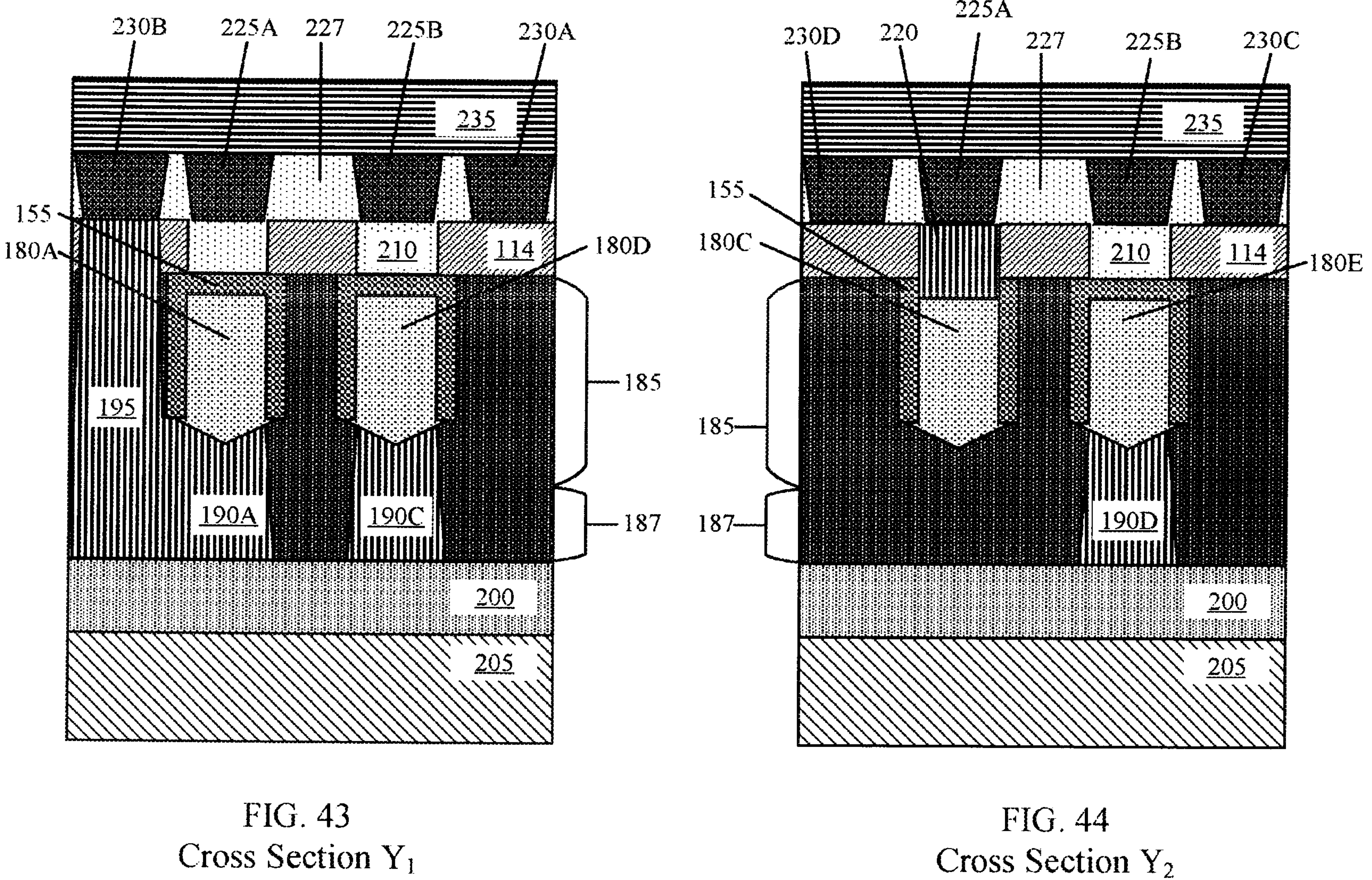

FIGS. 42-44 illustrate cross sections X, $Y_1$, and $Y_2$, respectively, of the plurality of nanodevices ND1, ND2 after the formation of a backside power distribution network (BSPDN) 235, in accordance with the embodiment of the present invention. In FIG. 42, the BSPDN 235 is formed directly atop the first BPR 225A. In FIG. 43, the BSPDN 235 is formed directly atop the additional BILD layer 227, the first BPR 225A, the second BPR 225B, the first backside signal line 230A, and the second backside signal line 230B. In FIG. 44, the BSPDN 235 is formed directly atop the additional BILD layer 227, the first BPR 225A, the second BPR 225B, the third backside signal line 230C and the fourth backside signal line 230D.

Figure 45:
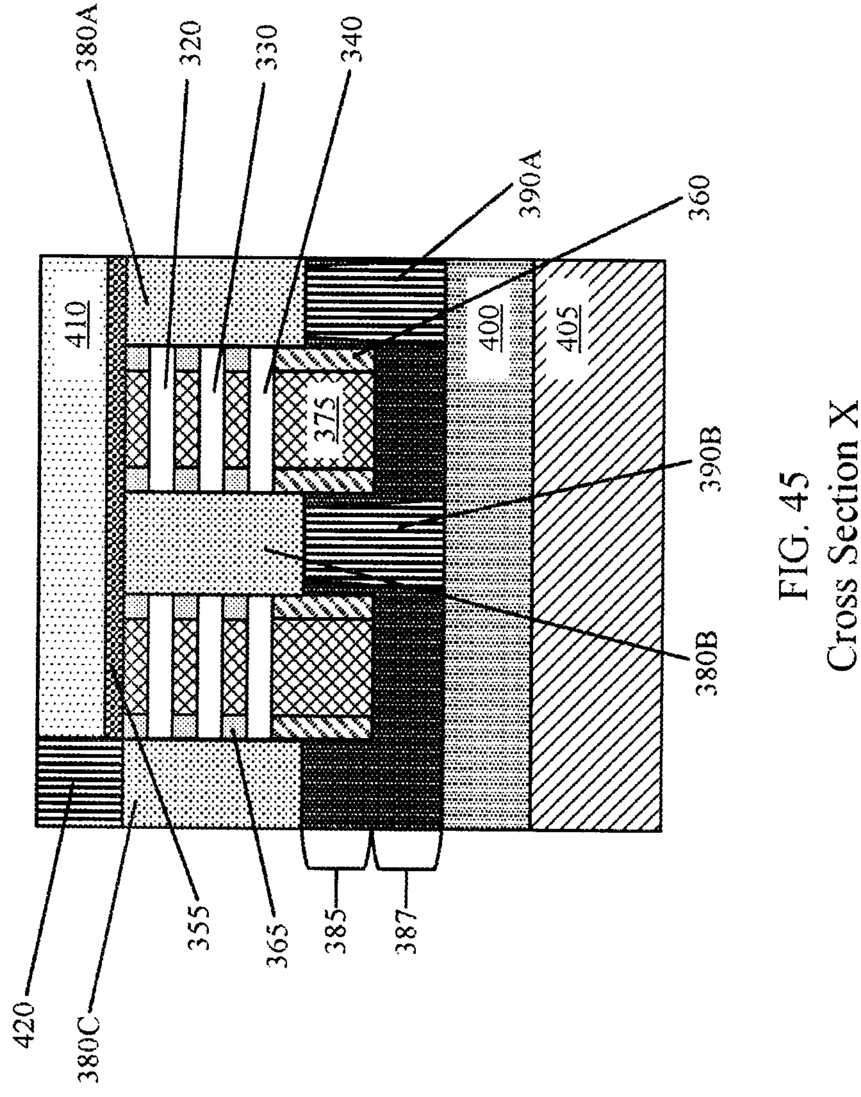
FIGS. 45-47 illustrate cross sections X, $Y_1$, and $Y_2$, respectively, of the plurality of nanodevices after the formation of a backside contact and CMP, in accordance with the embodiment of the present invention.
Figures 46, 47:
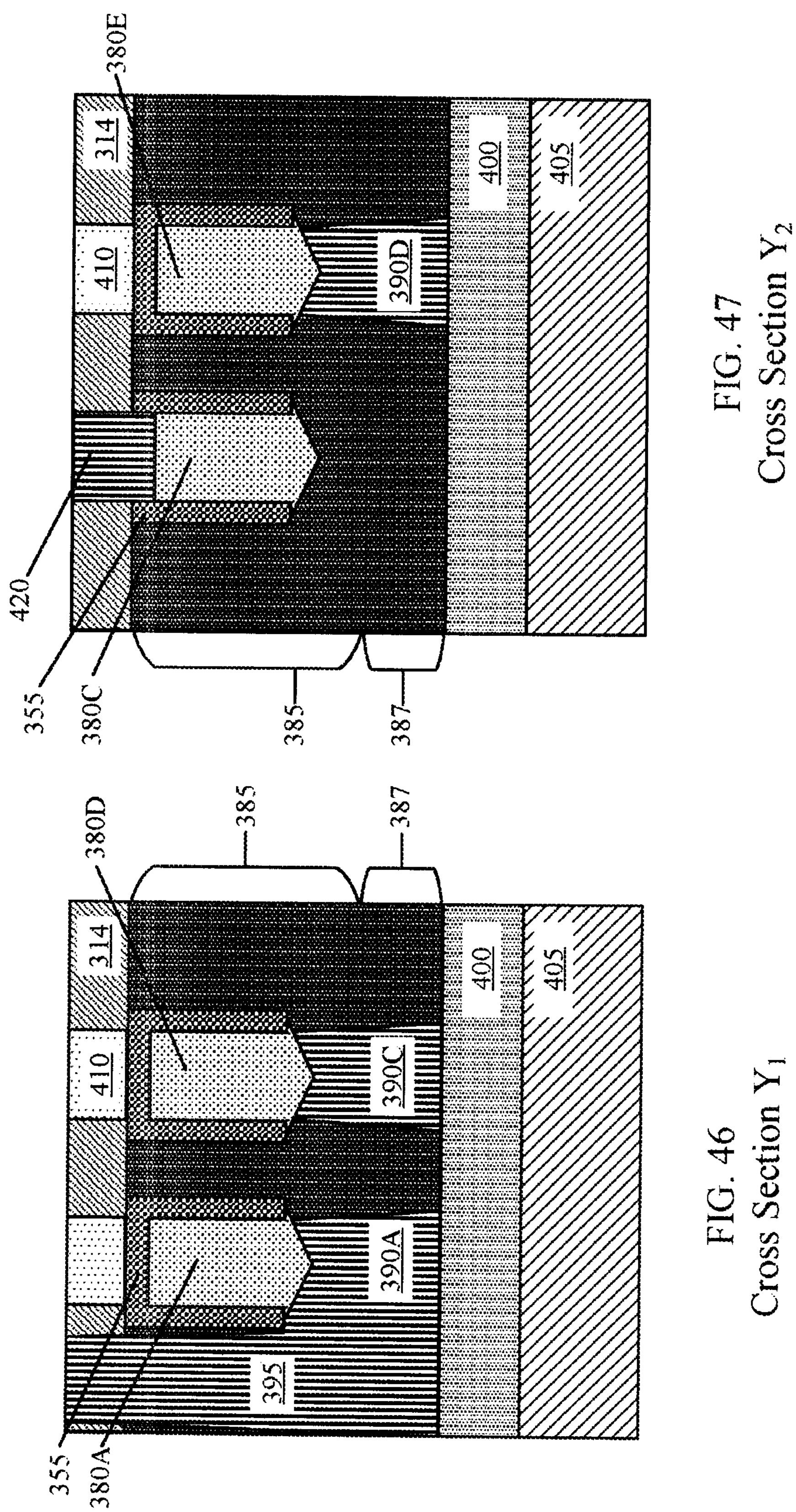

FIGS. 45-47 illustrate cross sections X, $Y_1$, and $Y_2$, respectively, of the plurality of nanodevices ND1, ND2 after the formation of a plurality of source/drains 380A, 380B, 380C. 380D, 380E, a BEOL layer 400, a carrier wafer 405, a backside contact 420 and CMP, in accordance with the embodiment of the present invention. The trench 215 is filled with a conductive metal (e.g., including a silicide liner, such as Ni. Ti, NiPt, an adhesion metal liner, such as TiN and conductive metal fill, such as W, Co, or Ru) to form the backside contact 420. Then, a portion of the BILD layer 410 and the STI region 314 are selectively removed by, for example, CMP to expose a top surface of the VBPS 395 and a top surface of the backside contact 420.

Figure 48:
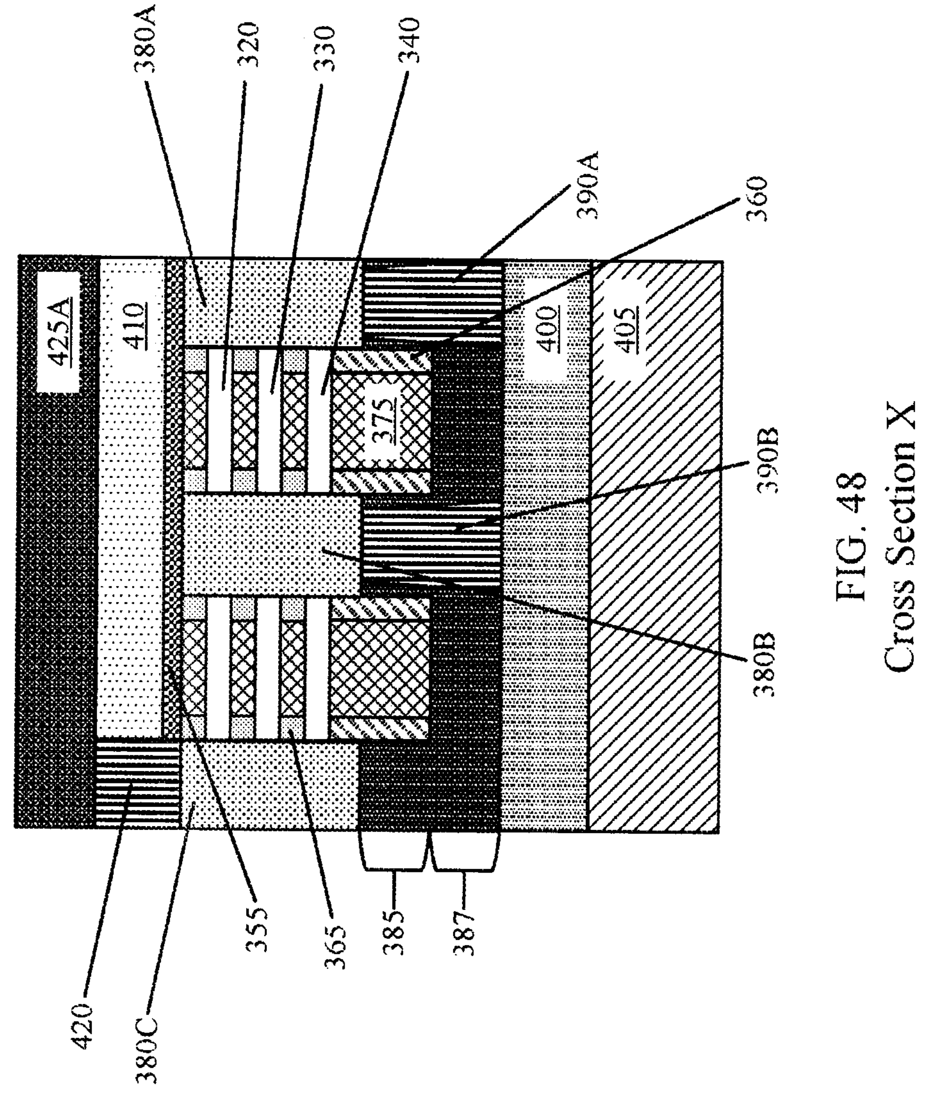
FIGS. 48-50 illustrate cross sections X, $Y_1$, and $Y_2$, respectively, of the plurality of nanodevices after the formation of a plurality of BPRs, in accordance with the embodiment of the present invention.
Figures 49, 50:
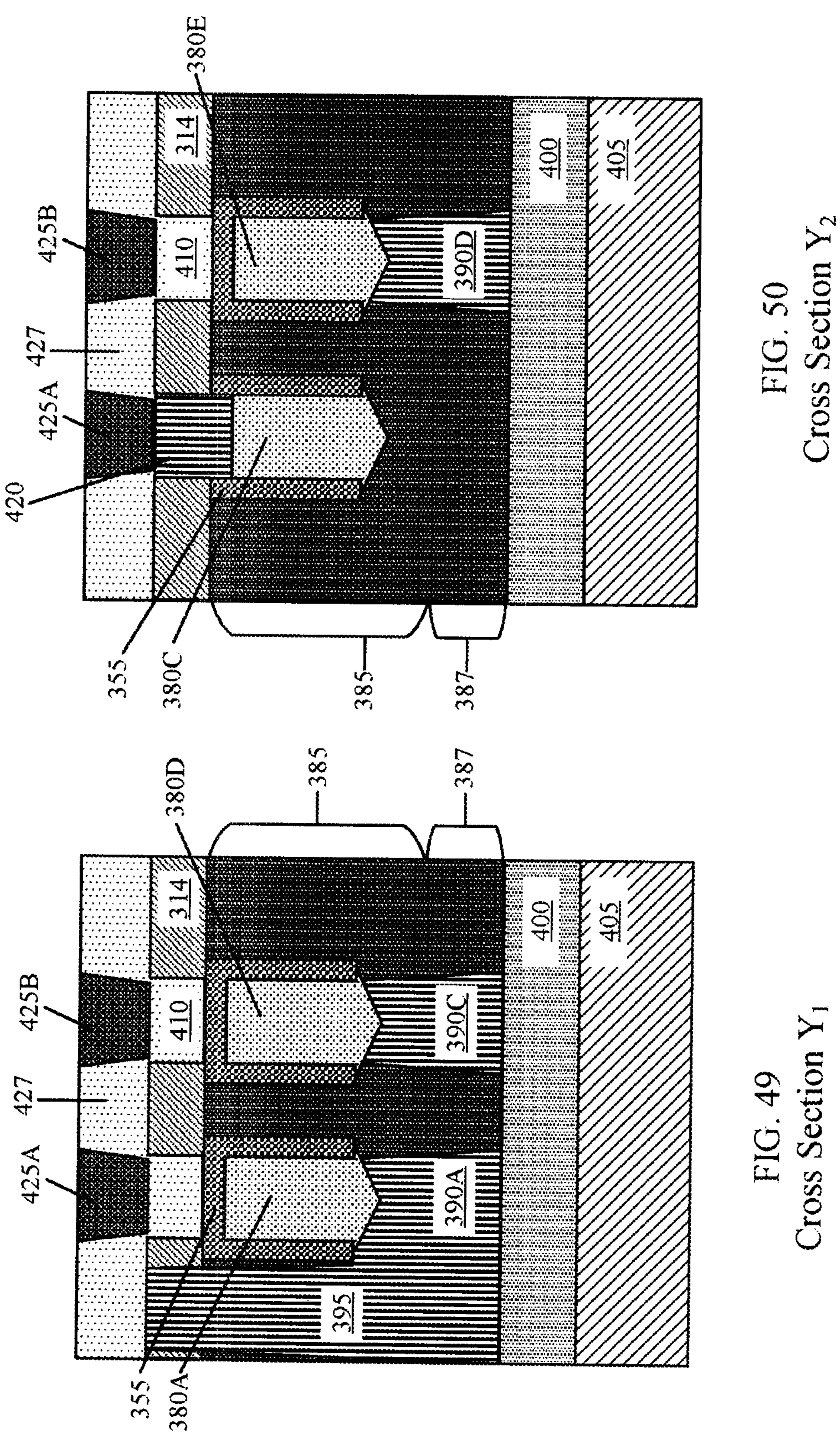

FIGS. 48-50 illustrate cross sections X, $Y_1$, and $Y_2$, respectively, of the plurality of nanodevices ND1, ND2 after the formation of a plurality of BPRs 425A, 425B, in accordance with the embodiment of the present invention. The first BPR 425A and the second BPR 425B are patterned using conventional lithography and etching processes, followed by metallization (e.g., Cu, Co or Ru fill with adhesion liner such as TiN).

In FIG. 48, the first BPR 425A is formed directly atop the BILD layer 410 and the backside contact 420. A top surface of backside contact 420 is connected to the first BPR 425A.

In FIG. 49, an additional BILD layer 427 is deposited directly atop the BILD layer 410, the VBPS 395, and the STI region 314. The first BPR 425A and the second BPR 425B are formed directly atop the BILD layer 410. A bottom surface of the first BPR 425A and the second BPR 425B are in direct contact with the BILD layer 410. The sidewalls of the first BPR 425A and the second BPR 425B are in direct contact with the additional BILD layer 427.

In FIG. 50, the additional BILD layer 427 is deposited directly atop the BILD layer 410, the backside contact 420, and the STI region 314. The first BPR 425A is formed directly atop the backside contact 420. The top surface of the backside contact 420 is connected to the first BPR 425A. The second BPR 425B is formed directly atop the BILD layer 410. A bottom surface of the second BPR 425B is in direct contact with the BILD layer 410. The sidewalls of the first BPR 425A and the second BPR 425B are in direct contact with the additional BILD layer 427.

Figure 51:
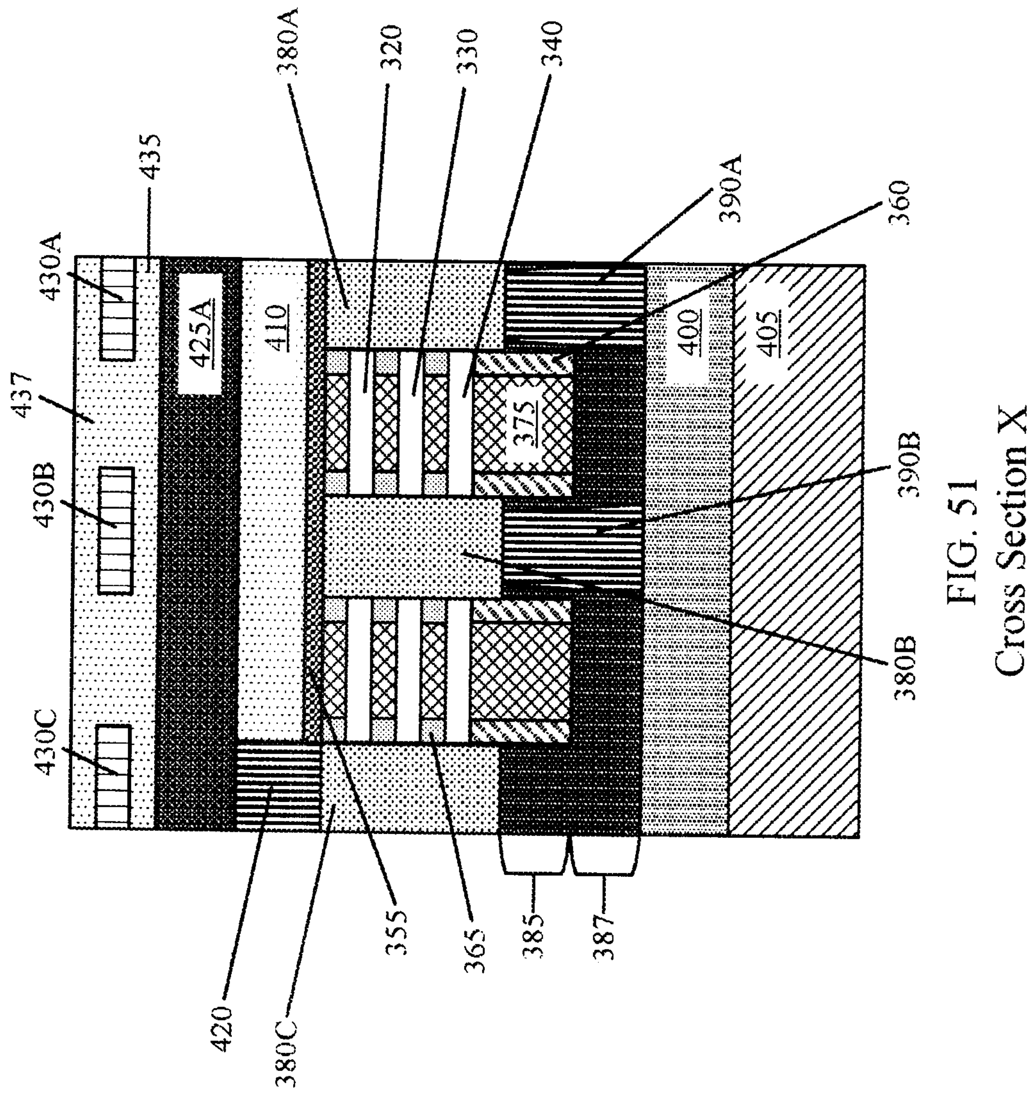
FIGS. 51-53 illustrate cross sections X, $Y_1$, and $Y_2$, respectively, of the plurality of nanodevices after the formation of a plurality of backside signal lines and a skip via, in accordance with the embodiment of the present invention.
Figures 52, 53:
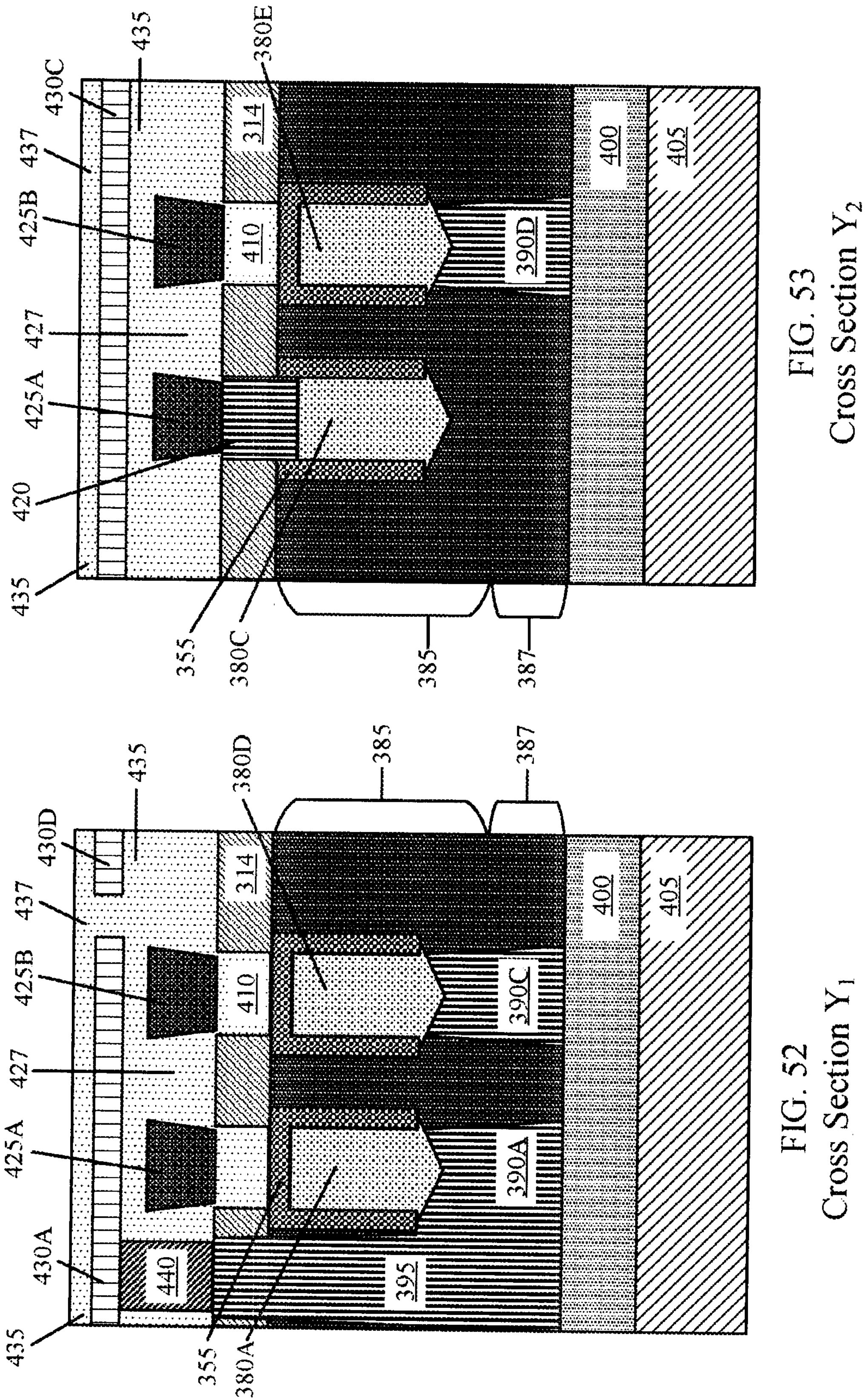

FIGS. 51-53 illustrate cross sections X, $Y_1$, and $Y_2$, respectively, of the plurality of nanodevices ND1, ND2 after the formation of a plurality of backside signal lines 430A, 430B, 430C, 430D and a skip via 440, in accordance with the embodiment of the present invention. The first backside signal line 430A, the second backside signal line 430B, the third backside signal line 430C, and the fourth backside signal line 430D are patterned using conventional lithography and etching processes, followed by metallization (e.g., Cu, Co or Ru fill with adhesion liner such as TiN).

In FIG. 51, a second additional BILD layer 435 is deposited directly atop the first BPR 425A. The first backside signal line 430A, the second backside signal line 430B, and the third backside signal line 430C are formed directly atop the second additional BILD layer 435. A third additional BILD layer 437 is deposited directly atop the second additional BILD layer 435 and the first backside signal line 430A, the second backside signal line 430B, and the third backside signal line 430C. At least one sidewall of the first backside signal line 430A and the third backside signal line 430C is in direct contact with the third additional BILD layer 437. The sidewalls of the second backside signal line 430B are in direct contact with the third additional BILD layer 437.

In FIG. 52, the second additional BILD layer 435 is deposited directly atop the first BPR 425A, the second BPR 425B, and the additional BILD layer 427. The skip via 440 is located directly atop the VBPS 395. A bottom surface of the skip via 440 is connected to the VBPS 395. The first backside signal line 430A is connected to the VBPS 395 by the skip via 440. A portion of the sidewalls of the skip via 440 are in contact with the second additional BILD layer 435, or the additional BILD layer 427, respectively. The first backside signal line 430A is formed directly atop the second additional BILD layer 435 and the skip via 440. The VBPS 395 is connected to the first backside signal line 430A by the skip via 440. The third additional BILD layer 437 is deposited directly atop the second additional BILD layer 435, the first backside signal line 430A, and the fourth backside signal line 430D. At least one sidewall of the first backside signal line 430A and the fourth backside signal line 430D is in direct contact with the third additional BILD layer 437.

In FIG. 53, the second additional BILD layer 435 is deposited directly atop the first BPR 425A, the second BPR 425B, and the additional BILD layer 427. The third backside signal line 430C is formed directly atop the second additional BILD layer 435. The third additional BILD layer 437 is deposited directly atop the third backside signal line 430C. The third backside signal line 430C is located between the second additional BILD layer 435 and the third additional BILD layer 437. The third backside signal line 430C bypasses the first BPR 425A and the second BPR 425B along a y-axis.

FIG. 54 illustrates a top-down view of the plurality of nanodevices ND1, ND2 after the formation of the VBPS 395, the skip via 440, the plurality of source/drain contacts 390A, 390B, 390C, 390D, 390E, the backside contact 420, the plurality of BPRs 425A, 425B, and the plurality of backside signal lines 430A, 430B, 430C, 430D, 430E, in accordance with the embodiment of the present invention. FIG. 54 is meant to illustrate the final structure of the semiconductor device. The second nanodevice ND2 includes the first source/drain contact 390A, the second source/drain contact 390B, and the backside contact 420. The first nanodevice ND1 includes the third source/drain contact 390C, the fourth source/drain contact 390D, and the fifth source/drain contact 390E. The second source/drain contact 390B and the fifth source/drain contact 390E are located between two gates 375. The second nanodevice ND2 includes the first BPR 425A (i.e., the second BPR in the claims). The first nanodevice ND1 includes the second BPR 425B (i.e., the first BPR in the claims). The first BPR 425A is located adjacent and parallel to the second BPR 425B along the x-axis. The first backside signal line 430A, the second backside signal line 430B, and the third backside signal line 430C extend perpendicular to the x-axis along the y-axis through the first nanodevice ND1 and the second nanodevice ND2. The first backside signal line 430A, the second backside signal line 430B, and the third backside signal line 430C overlap the first BPR 425A and the second BPR 425B along the y-axis. The fourth backside signal line 430D is located at a cell boundary of the first nanodevice ND1. The fifth backside signal line 430E is located at a cell boundary of the second nanodevice ND2. The first backside signal line 430A, the second backside signal line 430B, the third backside signal line 430C, the fourth backside signal line 430D, and the fifth backside signal line 430E are substantially in a same plane. The first BPR 425A and the second BPR 425B lie in a different plane than the first backside signal line 430A, the second backside signal line 430B, the third backside signal line 430C, the fourth backside signal line 430D, and the fifth backside signal line 430E.

The length LS1 of the first backside signal line 430A, the length LS2 of the second backside signal line 430B, the length LS3 of the third backside signal line 430C, the length LS4 of the fourth backside signal line 430D, and the length LS5 of the fifth backside signal line 430E perpendicular to the x-axis and parallel to the y-axis is from 25 nm to 500 nm.

Figure 55:
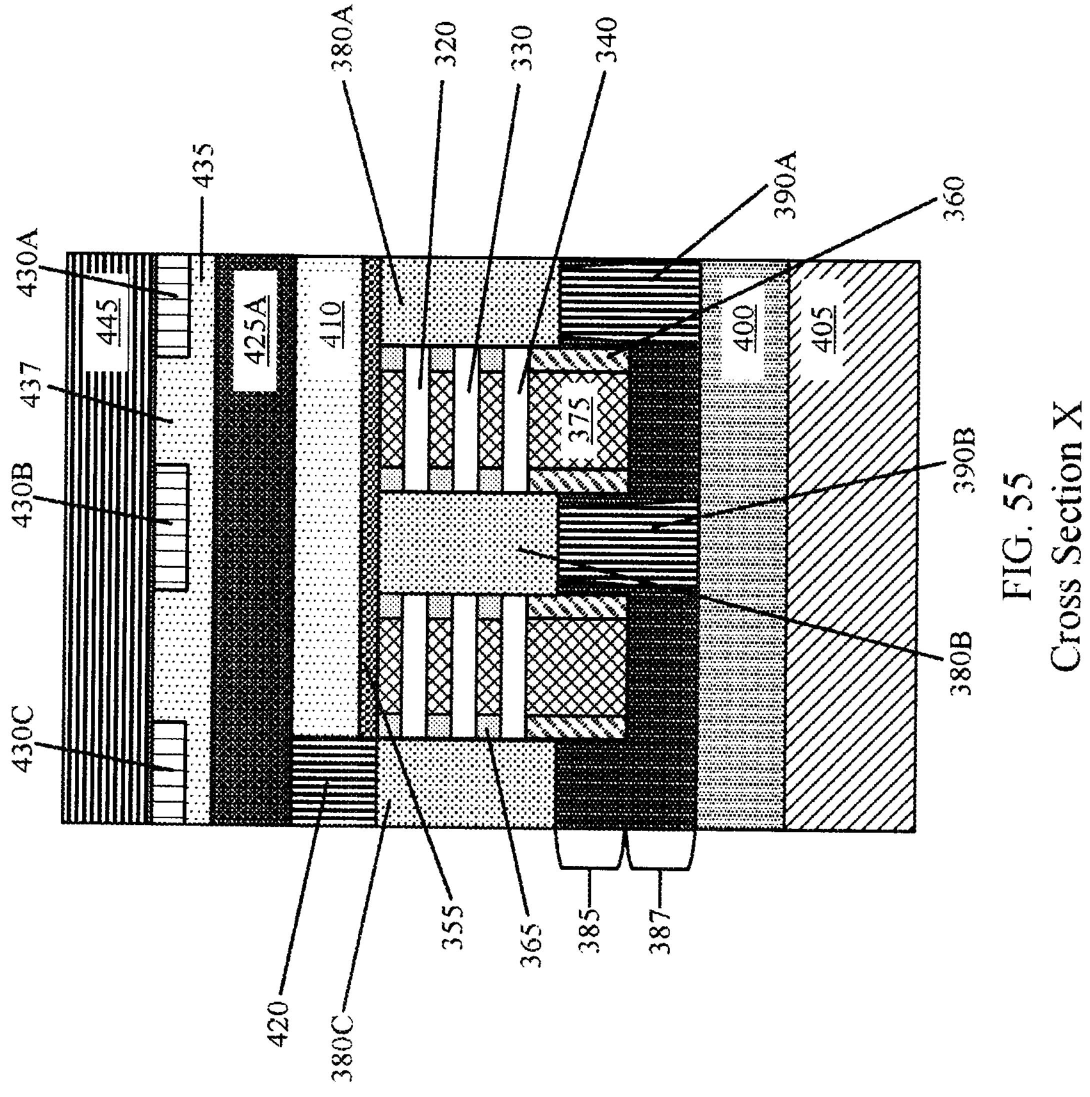
FIGS. 55-57 illustrate cross sections X, $Y_1$, and $Y_2$, respectively, of the plurality of nanodevices after the formation of a BSPDN, in accordance with the embodiment of the present invention.
Figures 56, 57:
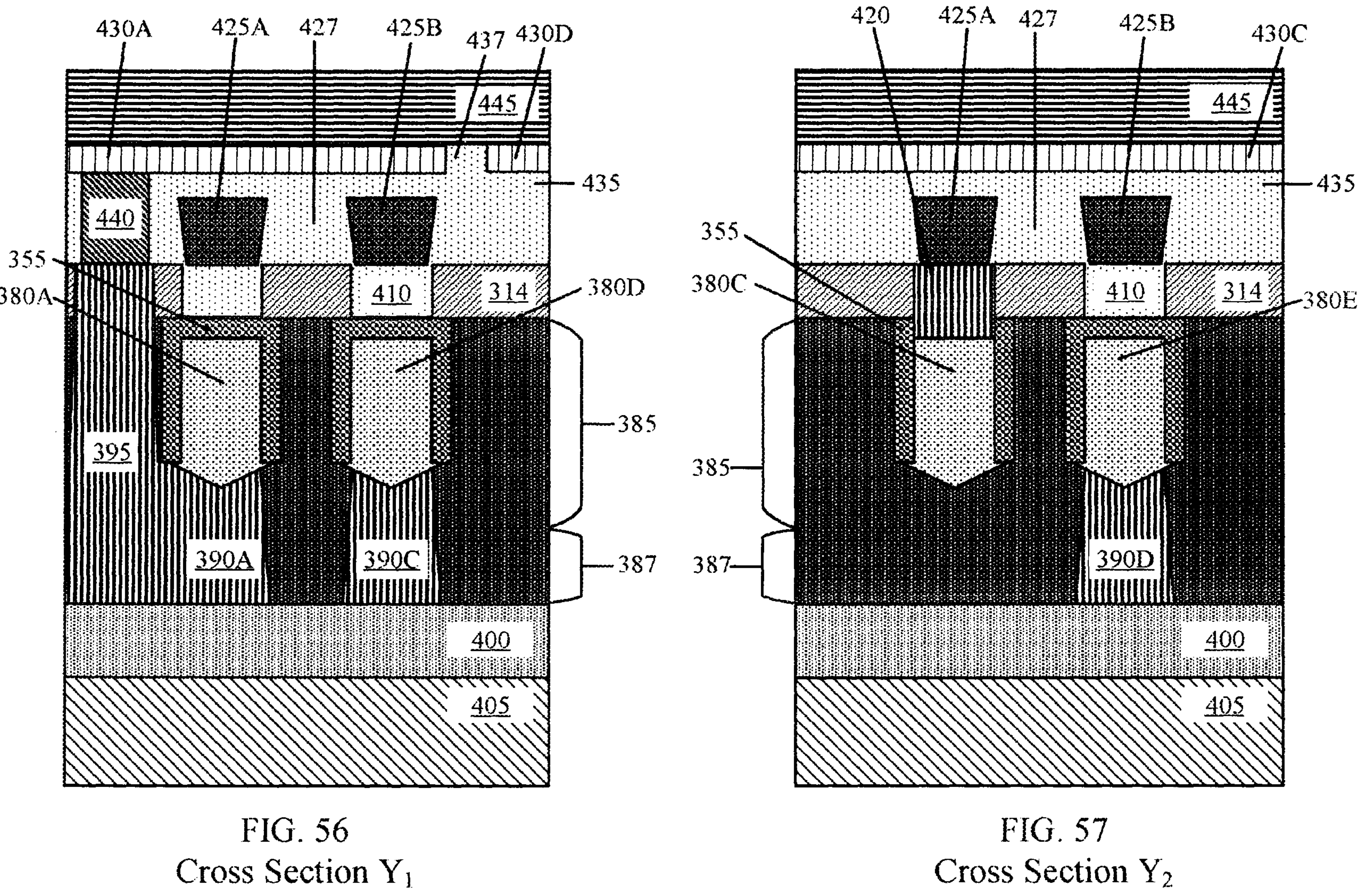

FIGS. 55-57 illustrate cross sections X, $Y_1$, and $Y_2$, respectively, of the plurality of nanodevices ND1, ND2 after the formation of a BSPDN 445, in accordance with the embodiment of the present invention. In FIG. 55, a portion of the third additional BILD layer 437 is selectively removed by, for example, CMP to expose a top surface of the first backside signal line 430A, the second backside signal line 430B, and the third backside signal line 430C. The BSPDN 445 is formed directly atop the third additional BILD layer 437, the first backside signal line 430A, the second backside signal line 430B, and the third backside signal line 430C.

In FIG. 56, a portion of the third additional BILD layer 437 is selectively removed by, for example, CMP to expose a top surface of the first backside signal line 430A and the fourth backside signal line 430D. The BSPDN 445 is formed directly atop the third additional BILD layer 437, the first backside signal line 430A, and the fourth backside signal line 430D.

In FIG. 57, the third additional BILD layer 437 is removed by, for example, CMP. The BSPDN 445 is formed directly atop the third backside signal line 430C.

The plurality of backside signal lines 230A, 230B, 230C, 230D are located at cell boundaries of the plurality of nanodevices ND1, ND2. The first gap G1 exists between the first backside power line 230A and the third backside power line 230C. The second gap G2 exists between the second backside power line 230B and the fourth backside power line 230D. The first backside signal line 230A, the second backside signal line 230B, the third backside signal line 230C, and the fourth backside signal line 230D extend the first width WS1, second width WS2, third width WS3, and fourth width WS4, respectively, parallel to the x-axis. The first BPR 225A and the second BPR 225B extend the first width WP1 and second width WP2, respectively, parallel to the x-axis, where the first width WP1 and the second width WP2 are equivalent. The widths WP1, WP2 of the plurality of BPRs 225A, 225B parallel to the x-axis are greater than the widths WS1, WS2, WS3, WS4 of the plurality of backside signal lines 230A, 230B, 230C, 230D parallel to the x-axis.

The first backside signal line 430A, the second backside signal line 430B, the third backside signal line 430C, the fourth backside signal line 430D, and the fifth backside signal line 430E extend the first length LS1, second length LS2, third length LS3, fourth length LS4, and fifth length LS5, respectively, parallel to the y-axis. The first backside signal line 430A, the second backside signal line 430B, and the third backside signal line 430C overlap the first BPR 425A and the second BPR 425B along the y-axis. The third backside signal line 430C overlaps and bypasses the first BPR 425A and the second BPR 425B along the y-axis. The fourth backside signal line 430D is located at the cell boundary of the first nanodevice ND1. The fifth backside signal line 430E is located at the cell boundary of the second nanodevice ND2.

It may be appreciated that FIGS. 1-57 provide only an illustration of one implementation and do not imply any limitations with regard to how different embodiments may be implemented. Many modifications to the depicted environments may be made based on design and implementation requirements.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
- a first nanodevice comprised of a plurality of first transistors;
- a second nanodevice comprised of a plurality of second transistors, wherein the second nanodevice is located adjacent to and parallel to the first nanodevice along an x-axis;
- a first backside signal line and a second backside signal line located at a cell boundary of the first nanodevice, wherein the first backside signal line and the second backside signal line are segmented such that the segments define a first empty space between the first backside signal line and the second backside signal line; and
- a plurality of gates extending through the first nanodevice and the second nanodevice, wherein the first backside signal line and the second backside signal line avoid contact with the plurality of gates along the x-axis.

2. The semiconductor device of claim 1, wherein a width of the first empty space parallel to the x-axis is from 5 nanometers (nm) to 100 nm.

3. The semiconductor device of claim 1, further comprising:
- a first backside power rail (BPR) located adjacent to and parallel to the first backside signal line and the second backside signal line along the x-axis, wherein a width of the first BPR parallel to the x-axis is greater than a width of the first backside signal line and the second backside signal line parallel to the x-axis.

4. The semiconductor device of claim 3, further comprising:
- a second BPR located adjacent to and parallel to the first BPR along the x-axis, wherein a width of the second BPR parallel to the x-axis is equivalent to the width of the first BPR parallel to the x-axis.

5. The semiconductor device of claim 4, wherein the width of the first backside signal line and the second backside signal line parallel to the x-axis is 20 nm.

6. The semiconductor device of claim 5, wherein the width of the first BPR and the second BPR parallel to the x-axis is 40 nm.

7. A semiconductor device comprising:
- a first nanodevice comprised of a plurality of first transistors;

a second nanodevice comprised of a plurality of second transistors, wherein the second nanodevice is located adjacent to and parallel to the first nanodevice along an x-axis;

a first backside signal line and a second backside signal line located at a cell boundary of the first nanodevice, wherein the first backside signal line and the second backside signal line are segmented such that the segments define a first empty space between the first backside signal line and the second backside signal line;

a third backside signal line and a fourth backside signal line located at a cell boundary of the second nanodevice, wherein the third backside signal line and the fourth backside signal line are segmented such that the segments define a second empty space between the third backside signal line and the fourth backside signal line; and a plurality of gates extending through the first nanodevice and the second nanodevice, wherein the first backside signal line, the second backside signal line, the third backside signal line, and the fourth backside signal line avoid contact with the plurality of gates along the x-axis.

8. The semiconductor device of claim 7, wherein a width of the first empty space parallel to the x-axis is from 5 nanometers (nm) to 100 nm, and wherein a width of the second empty space parallel to the x-axis is equivalent to the width of the first empty space parallel to the x-axis.

9. The semiconductor device of claim 7, further comprising:

a first backside power rail (BPR) and a second BPR located between the first backside signal line, the second backside signal line, the third backside signal line, and the fourth backside signal line, wherein a width of the first BPR and the second BPR parallel to the x-axis is greater than a width of the first backside signal line, the second backside signal line, the third backside signal line, and the fourth backside signal line parallel to the x-axis.

10. The semiconductor device of claim 9, wherein the first BPR, the second BPR, the first backside signal line, the second backside signal line, the third backside signal line, and the fourth backside signal line are substantially in a same plane.

11. The semiconductor device of claim 10, wherein the width of the first backside signal line, the second backside signal line, the third backside signal line, and the fourth backside signal line parallel to the x-axis is 20 nm.

12. The semiconductor device of claim 11, wherein the width of the first BPR and the second BPR parallel to the x-axis is 40 nm.

13. The semiconductor device of claim 12, further comprising:

a source/drain contact including a via (VBPS), wherein the VBPS extends downwards to connect to a frontside of the third backside signal line.

14. The semiconductor device of claim 13, further comprising:

a source/drain in direct contact with a backside of the source/drain contact, wherein the third backside signal line is connected to the source/drain by the VBPS.

15. A semiconductor device comprising:

a first nanodevice comprised of a plurality of first transistors, wherein the first nanodevice includes a first backside power rail (BPR);

a second nanodevice comprised of a plurality of second transistors, wherein the second nanodevice includes a second BPR, wherein the second nanodevice is located adjacent to and parallel to the first nanodevice along an x-axis;

a first backside signal line, a second backside signal line, and a third backside signal line extending perpendicular to the x-axis along a y-axis through the first nanodevice and the second nanodevice, wherein the first backside signal line, the second backside signal line, and the third backside signal line overlap the first BPR and the second BPR along the y-axis;

a skip via connected to a frontside of the first backside signal line; and a source/drain contact including a via (VBPS), wherein the VBPS extends downwards to connect to a frontside of the skip via.

16. The semiconductor device of claim 15, wherein the third backside signal line bypasses the first BPR and the second BPR along the y-axis.

17. The semiconductor device of claim 16, further comprising:

a fourth backside signal line located at a cell boundary of the first nanodevice; and a fifth backside signal line located at a cell boundary of the second nanodevice.

18. The semiconductor device of claim 17, wherein the first backside signal line, the second backside signal line, the third backside signal line, the fourth backside signal line, and the fifth backside signal line are substantially in a same plane.

19. The semiconductor device of claim 18, wherein the first BPR and the second BPR lie in a different plane than the first backside signal line, the second backside signal line, the third backside signal line, the fourth backside signal line, and the fifth backside signal line.

20. The semiconductor device of claim 19, wherein a length of the first backside signal line, the second backside signal line, the third backside signal line, the fourth backside signal line, and the fifth backside signal line parallel to the y-axis is from 25 nanometers (nm) to 500 nm.

* * * * *